United States Patent
Yoshizumi et al.

(10) Patent No.: US 8,075,945 B2
(45) Date of Patent: Dec. 13, 2011

(54) MANUFACTURING METHOD OF WIRING AND STORAGE ELEMENT

(75) Inventors: Kensuke Yoshizumi, Kanagawa (JP); Noriko Harima, Kanagawa (JP); Tomoko Yamada, Ohsaka (JP)

(73) Assignee: Semiconductor Energy Laboratory Co., Ltd. (JP)

(*) Notice: Subject to any disclaimer, the term of this patent is extended or adjusted under 35 U.S.C. 154(b) by 566 days.

(21) Appl. No.: 12/038,453

(22) Filed: Feb. 27, 2008

(65) Prior Publication Data

US 2008/0220155 A1    Sep. 11, 2008

(30) Foreign Application Priority Data

Mar. 5, 2007 (JP) ................... 2007-053712

(51) Int. Cl.
*B05D 3/06* (2006.01)
*B05D 5/12* (2006.01)
(52) U.S. Cl. .......... 427/98.3; 427/98.2; 427/558
(58) Field of Classification Search .......... 427/98.2, 427/98.3, 558
See application file for complete search history.

(56) References Cited

U.S. PATENT DOCUMENTS

| | | | | |
|---|---|---|---|---|
| 6,821,906 B2* | 11/2004 | Wada et al. | | 438/708 |
| 6,878,980 B2* | 4/2005 | Gudesen et al. | | 257/295 |
| 7,468,529 B2* | 12/2008 | Kawai et al. | | 257/102 |
| 7,935,266 B2* | 5/2011 | Kume et al. | | 216/94 |
| 2003/0103370 A1* | 6/2003 | Chow | | 365/145 |
| 2003/0108665 A1* | 6/2003 | Biro et al. | | 427/162 |
| 2004/0263564 A1 | 12/2004 | Maekawa et al. | | |
| 2006/0046336 A1 | 3/2006 | Shoji et al. | | |
| 2006/0210815 A1 | 9/2006 | Furusawa et al. | | |

FOREIGN PATENT DOCUMENTS

| | | |
|---|---|---|
| JP | 2001-015472 | 1/2001 |
| JP | 2001-15472 | 1/2001 |
| JP | 2003317945 | * 11/2003 |
| JP | 2006-291347 | 10/2006 |

OTHER PUBLICATIONS

Shimoda, T., "39.1: Invited Paper: Ink-Jet Technology for Fabrication Processes of Flat Panel Displays," SID 03 Digest, SID International Symposium Digest of Technical Papers, 2003, pp. 1178-1181.

* cited by examiner

*Primary Examiner* — Brian K Talbot
(74) *Attorney, Agent, or Firm* — Husch Blackwell LLP

(57) ABSTRACT

In a coating method, such as a droplet discharge method which requires baking, it is an object of the present invention to reduce the baking temperature at the time of forming a wiring and a conductive film. As a feature of the present invention, a composition, in which nanoparticles of a conductive material are dispersed in a solvent, is discharged using a droplet discharge method, and then dried to vaporize the solvent. Then, pretreatment using active oxygen is performed. After which, baking is then performed, whereby a wiring and a conductive film are formed. By performance of the pretreatment by active oxygen before the baking, a baking temperature at the time of forming the wiring and conductive film can be reduced.

23 Claims, 16 Drawing Sheets

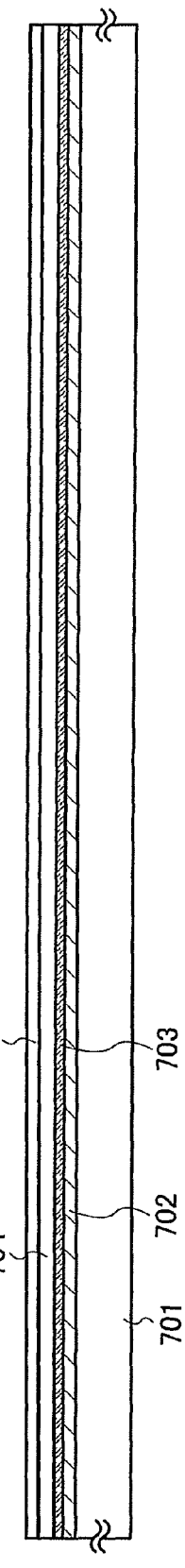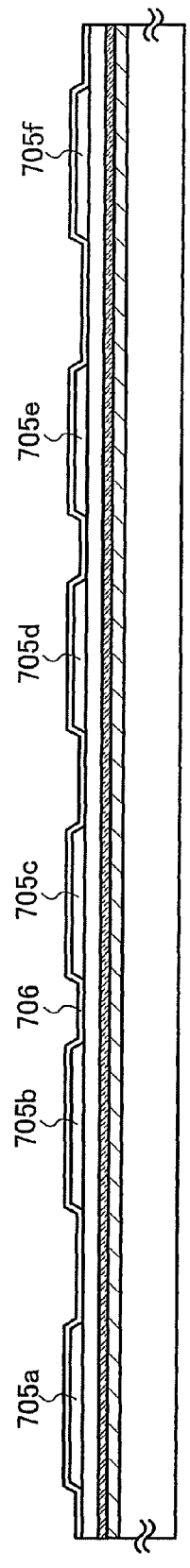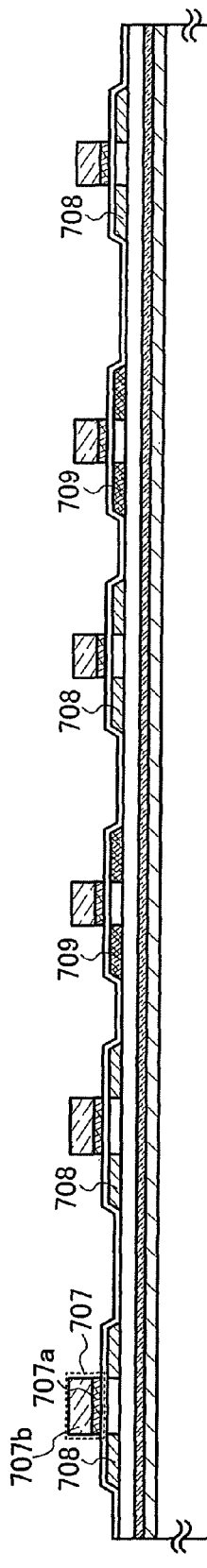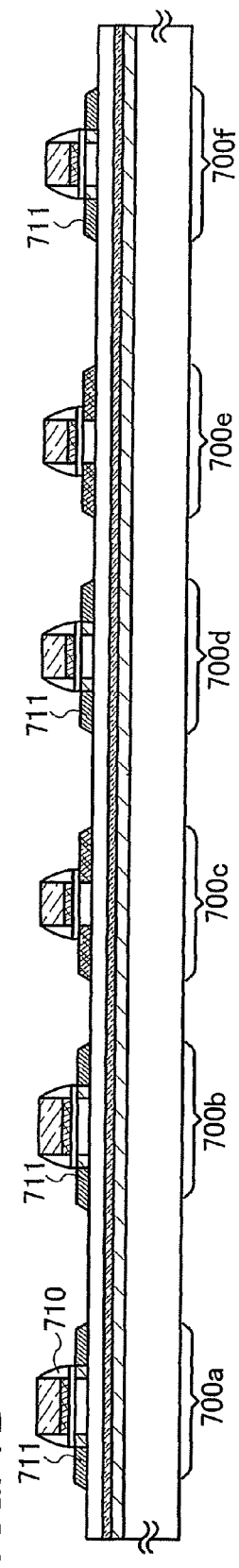
FIG. 7A
FIG. 7B
FIG. 7C
FIG. 7D

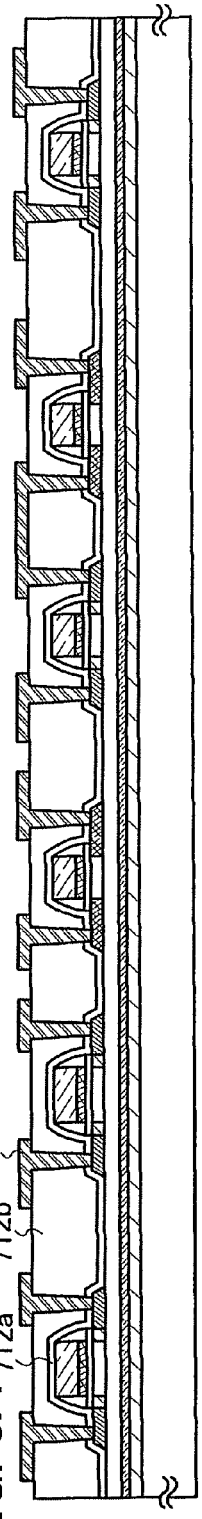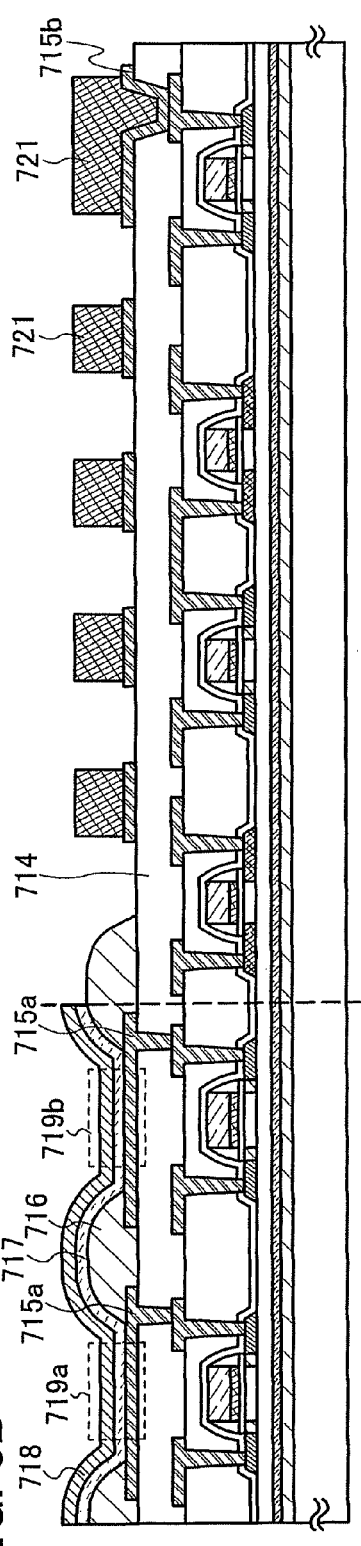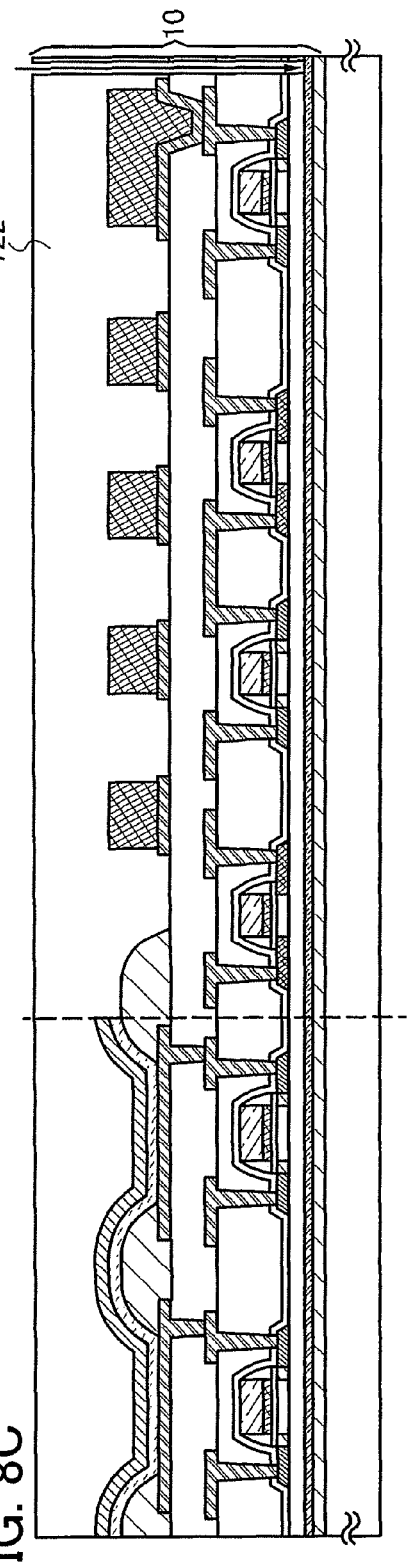

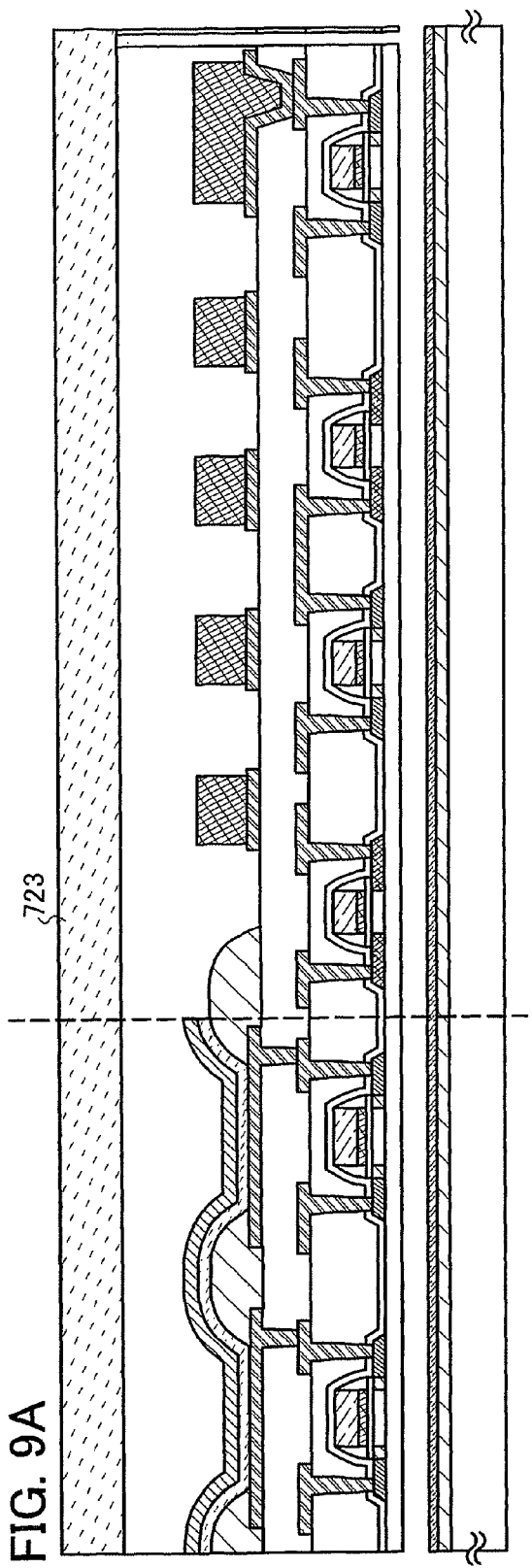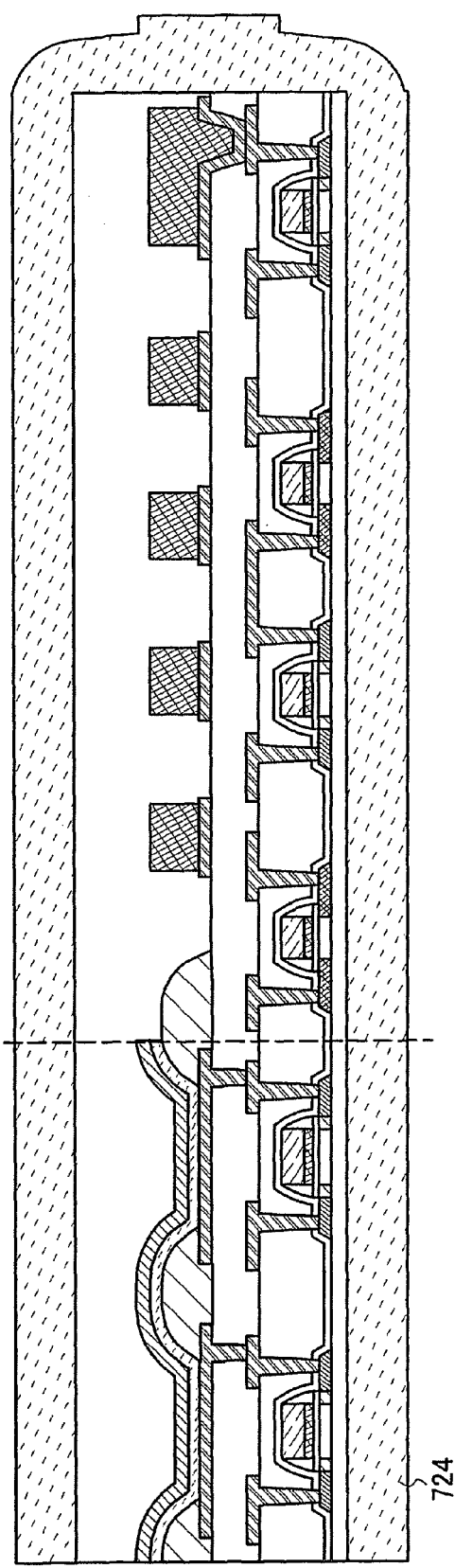
FIG. 9A
FIG. 9B

US 8,075,945 B2

MANUFACTURING METHOD OF WIRING AND STORAGE ELEMENT

BACKGROUND OF THE INVENTION

1. Field of the Invention

The present invention relates to methods for manufacturing a conductive film typified by a wiring.

2. Description of the Related Art

In recent years, pattern formation using a droplet discharge method typified by an ink-jet method has been applied to a field of flat panel displays and actively developed. A droplet discharge method has many advantages in that no mask is required because patterns are directly drawn, application to a large-sized substrate is easy, and efficiency in the use of materials is high, for example. Therefore, a droplet discharge method has been applied to the manufacture of color filters, electrodes of plasma displays, or the like (for example, see Non-patent Document 1: T. Shimoda, Ink-jet Technology for Fabrication Processes of Flat Panel Displays, SID '03 DIGEST, pp. 1178-1181).

For example, a conductive film using a droplet discharge method is formed by coating of a composition containing conductive particles which are dispersed in a solvent, and then performing drying and baking thereof. Besides the solvent, an organic compound such as a dispersant which disperses conductive particles in a solvent is contained in the composition. Therefore, the organic compound is removed by decomposition and is baked at a high temperature to sinter the conductive particles.

In the meantime, a technology which uses ultraviolet irradiation at the same time as baking to suppress a baking temperature to be low is disclosed in Patent Document 1: Japanese Published Patent Application No. 2006-291347. Note that a value which depends on a substance used for a dispersant is disclosed as a wavelength of an ultraviolet ray to be used.

However, the temperature is as high as 150° C., and baking at a lower temperature is necessary in a case where a conductive film is formed over an organic film, a plastic substrate, or the like, for example.

SUMMARY OF THE INVENTION

Thus, an object of the present invention is to reduce a baking temperature at the time of forming a wiring and a conductive film by a coating method such as a droplet discharge method which requires baking. Another object of the present invention is to easily and conveniently form a wiring and a conductive film, as well as to provide a highly reliable semiconductor device using the wiring and the conductive film, at low cost.

In the present invention, a composition in which nanoparticles of a conductive material are dispersed in a solvent, is discharged and then dried to vaporize the solvent with the use of a coating method such as a droplet discharge method. Then, baking is performed after pretreatment by active oxygen is performed, whereby a wiring and a conductive film are formed. By performance of the pretreatment by active oxygen before baking, a baking temperature at the time of the formation can be reduced. Further, since efficiency in the use of materials is high, a wiring and a conductive film having a desired shape can be simply formed at low cost. Furthermore, since a high baking temperature is not necessary, damage to other layers can be suppressed. Thus, it is possible to expand an application range of a coating method typified by a droplet discharge method as a method for manufacturing a wring and a conductive film.

Active oxygen can be generated by ultraviolet irradiation under an ozone atmosphere, for example. Note that ozone may be supplied directly or supplied by irradiation with an ultraviolet ray of less than or equal to 240 nm to oxygen, for example.

Note that active oxygen can also be generated from oxygen besides ozone when oxygen is irradiated with an ultraviolet ray of less than or equal to 175 nm. Therefore, since active oxygen can be generated more efficiently when the ultraviolet ray of less than or equal to 175 nm is used, a baking temperature can be reduced with brief pretreatment According to one feature of the present invention, a method for manufacturing a wiring includes the steps of: discharging a composition in which nanoparticles of a conductive material are dispersed in a solvent; drying the composition; performing pretreatment on the composition in which the solvent has been vaporized by drying, with the use of active oxygen; and then performing baking.

According to another feature of the present invention, a method for manufacturing a wiring includes the steps of: discharging a composition in which nanoparticles of a conductive material are dispersed in a solvent; drying the composition; irradiating the composition in which the solvent has been vaporized, with an ultraviolet ray under an ozone atmosphere; and then performing baking.

According to another feature of the present invention, a method for manufacturing a wiring includes the steps of: discharging a composition in which nanoparticles of a conductive material are dispersed in a solvent; drying the composition; irradiating the composition in which the solvent has been vaporized, with an ultraviolet ray of less than or equal to 240 nm in the air; and then performing baking.

According to another feature of the present invention, a method for manufacturing a wiring includes the steps of: discharging a composition in which nanoparticles of a conductive material are dispersed in a solvent; drying the composition; irradiating the composition in which the solvent has been vaporized, with an ultraviolet ray of less than or equal to 175 nm in the air; and then performing baking.

According to another feature of the present invention, a method for manufacturing a storage element includes the steps of: forming a first conductive layer; forming a memory layer over the first conductive layer; discharging a composition in which nanoparticles of a conductive material are dispersed in a solvent, over the memory layer; drying the composition; performing pretreatment on the composition in which the solvent has been vaporized by drying, with the use of active oxygen; and then performing baking to form a second conductive layer.

According to another feature of the present invention, a method for manufacturing a storage element includes the steps of: forming a first conductive layer; forming a memory layer over the first conductive layer; discharging a composition in which nanoparticles of a conductive material are dispersed in a solvent, over the memory layer; drying the composition; irradiating the composition in which the solvent has been vaporized by drying, with an ultraviolet ray under an ozone atmosphere; and then performing baking to form a second conductive layer.

According to another feature of the present invention, a method for manufacturing a storage element includes the steps of: forming a first conductive layer; forming a memory layer over the first conductive layer; discharging a composition in which nanoparticles of a conductive material are dispersed in a solvent, over the memory layer; drying the composition; irradiating the composition in which the solvent has been vaporized by drying, with an ultraviolet ray of less than or equal to 240 nm in the air; and then performing baking to form a second conductive layer.

According to another feature of the present invention, a method for manufacturing a storage element includes the steps of: forming a first conductive layer; forming a memory layer over the first conductive layer; discharging a composition in which nanoparticles of a conductive material are dispersed in a solvent, over the memory layer; drying the composition; irradiating the composition in which the solvent has been vaporized by drying, with an ultraviolet ray of less than or equal to 175 nm in the air; and then performing baking to form a second conductive layer.

When voltage is applied to such a storage element, electric characteristics of a memory layer are changed and therefore data is written. For example, a resistance value may be given as an example of electric characteristics, and writing is performed utilizing change in the resistance value caused by connection between parts of a first conductive layer and a second conductive layer which form a pair when writing is performed, which is a short circuit (also known as, a short).

The storage element utilizes change in electric characteristics of the memory layer in this manner; therefore, initial characteristics of the memory layer before voltage application largely effects characteristics of the storage element. It is particularly effective to form the storage element using the present invention, in which a high baking temperature is not necessary at the time of forming the second conductive layer and damage to other layers can be suppressed.

Further, in this specification, the first conductive layer and the second conductive layer are also referred to as electrodes.

In the present invention, a substance used as a conductive material included in a composition, is not necessarily nanoparticles. Thus, the present invention is effective in a case where a conductive material and an organic substance are mixed before baking. Note that a conductive material sinters at a temperature lower than an inherent melting point of metal; therefore, a baking temperature can be made lower; thus, the present invention can be particularly effective. Accordingly, the case where nanoparticles are used for a conductive material contained in a composition is described in this specification.

According to the present invention, a wiring and a conductive film having a desired shape can be simply formed at low cost. Further, since a high baking temperature is not necessary at the time of forming a wiring and a conductive film, damage to other layers can be suppressed. Thus, it is possible to expand an application range of a coating method, which needs a baking step, as a method for manufacturing a wring, a conductive film, and the like. Furthermore, according to the present invention, a storage element and a semiconductor device, which are highly reliable, can be simply provided at low cost.

BRIEF DESCRIPTION OF THE DRAWINGS

In the accompanying drawings:

FIGS. 7A to 7D are partial cross-sectional views of a semiconductor device of the present invention;

FIGS. 8A to 8C are partial cross-sectional views of a semiconductor device of the present invention;

FIGS. 9A and 9B are partial cross-sectional views of a semiconductor device of the present invention;

DETAILED DESCRIPTION OF THE INVENTION

Figure 1A:
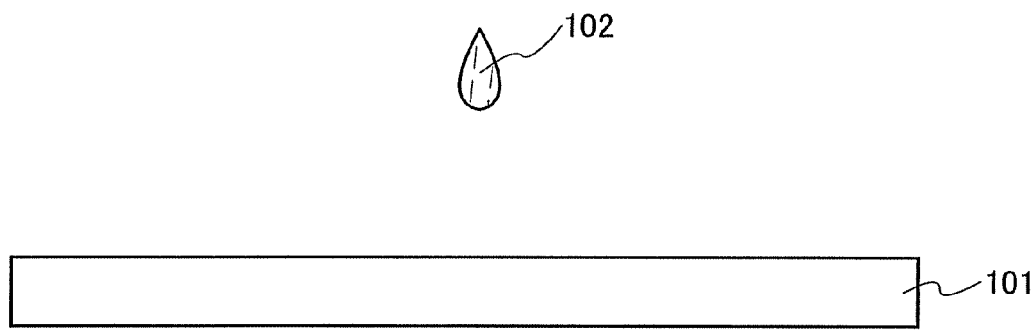
FIGS. 1A to 1C are views describing a method for manufacturing a wiring of the present invention.

Embodiment modes and embodiments of the present invention will be described hereinafter with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiment modes and embodiments below. Note that in structures of the present invention to be described below, there are cases where reference numerals denoting the same portions in different drawings are used in common.

Embodiment Mode 1

A method for manufacturing a wiring of the present invention will be described with reference to FIGS. 1A to 1C.

A substrate 101 can be a glass substrate, a quartz substrate, a metal substrate such as stainless steel which has an insulating film formed over one surface, a plastic substrate which has sufficient heat resistance to withstand treatment temperatures of this process, or the like.

Figure 1B:
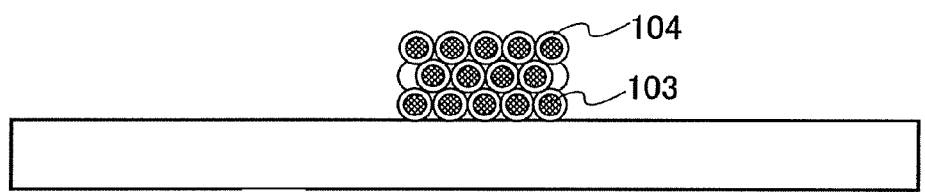

First, as illustrated in FIG. 1A, a composition containing a conductive material is discharged onto a desired position over the substrate 101 by a droplet discharge method. A droplet discharge method is a method by which patterns are formed by discharging droplets containing a predetermined substance from a small nozzle; here, a composition in which nanoparticles of a conductive material are dispersed in a solvent is discharged (ejected) as a droplet 102.

For a conductive material for forming the nanoparticles, a material which can be used as a wiring material can be used. For example, a metal element selected from gold (Au), silver (Ag), platinum (Pt), nickel (Ni), copper (Cu), palladium (Pd), tantalum (Ta), iridium (Ir), rhodium (Rh), tungsten (W), aluminum (Al), iron (Fe), zinc (Zn), tin (Sn), titanium (Ti), indium (In), and the like, or an alloy material containing such an element as its main component is used. Alternatively, a metal sulfide of cadmium (Cd) or zinc (Zn); an oxide of germanium (Ge), silicon (Si), zirconium (Zr), barium (Ba), the above metal element, or the like; or one or more silver halides may be mixed. Further alternatively, indium tin oxide (hereinafter referred to as ITO), indium tin oxide containing silicon, indium oxide containing 2 to 20 [wt %] of zinc oxide (ZnO) (abbreviation: IZO), or the like which is used as a transparent conductive film can also be used for the conductive material.

In the case where two or more kinds of elements or compounds are used as conductive materials, the mixture form is not limited in particular, for example, they may be uniform, or any one of them may be concentrated in the core portion.

The grain diameter of the nanoparticles is greater than or equal to 1 nm and less than or equal to 200 nm, preferably greater than or equal to 1 nm and less than or equal to 100 nm.

Note that the nanoparticles may be formed by any of a gas phase method, a liquid phase method, and a solid phase method, and a method for manufacturing the nanoparticles is not particularly limited.

For a solvent, water or an organic solvent can be used, and an organic solvent may be either a water-soluble organic solvent or a water-insoluble organic solvent. For example, as a water-soluble organic solvent, alcohols such as methanol, ethanol, propanol, butyl alcohol, glycerin, dipropylene glycol, or ethylene glycol; ketones such as acetone or methyl ethyl ketone; glycol ethers such as ethylene glycol monomethyl ether, ethylene glycol monoethyl ether, ethylene glycol monobutyl ether, or diethylene glycol monobutyl ether; a water-soluble nitrogen containing organic compound such as 2-pyrrolidone or N-methyl pyrrolidone; ethyl acetate; or the like can be used. Further, as a water-insoluble organic solvent, alkanes such as octane, nonan, or decane; aromatics such as cycloalkane, toluene, xylene, benzene, or dichlorobenzene; or the like can be used. Needless to say, not only one solvent is necessarily used but a mixture of a plurality of solvents may be used as long as phase separation does not occur between the solvents.

Note that the nanoparticles exist in a state where nanoparticles are coated with an organic substance in order to prevent the nanoparticles from cohering in a solvent. The organic substance corresponds to a dispersant having a function of dispersing particles stably. For example, the organic substance is formed of a surfactant, a substance which can form a coordinate bond with a metal element contained in the conductive material, or the like. Here, as the substance forming a coordinate bond with the metal element, a substance having a lone pair such as an amino group, a thiol group (—SH), a sulfanediyl group (—S—), a hydroxy group (—OH), an oxy group (—O—), a carboxyl group (—COOH), or a cyano group (—CN), which is on an atom of nitrogen, sulfur, oxygen, or the like can be used. For example, hydroxyamines such as ethanolamine; an amine-based compound such as oleylamine, polyethyleneimine, or polyvinylpyrrolidone; alcohols such as polyvinyl alcohol, alkanethiols, dithiols; glycols such as ethylene glycol, diethylene glycol, or polyethylene glycol; polyacrylic acid; carboxymethylcellulose; or the like can be used. Further, as the surfactant, for example, an anionic surfactant such as bis(2-ethylhexyl)sulfosuccinic acid or sodium dodecylbenzenesulfonate; a nonionic surfactant such as alkyl ester or alkyl phenyl ether of polyalkyl glycol; a fluorosurfactant; a copolymer having polyethyleneimine and polyethylene oxide; or the like can be used.

Thus, the nanoparticles of a conductive material coated with the organic substance are dispersed in a solvent and discharged. Note that the composition to be discharged (also referred to as a discharge material) may contain in some cases a substance used for forming nanoparticles, a binder, a plasticizer, a silane coupling agent, or the like besides a conductive material, a dispersant, and a solvent. As a binder, a thermosetting resin, for example, an organic resin such as polyimide, acrylic, a novolac resin, a melamine resin, a phenol resin, an epoxy resin, a silicone resin, a furan resin, or a diallyl phthalate resin can be used. Note that the binder can suppress generation of uneven sinter between the nanoparticles by contraction force of the thermosetting resin in a subsequent baking step. Alternatively, such a resin makes it also possible to adjust the viscosity of the discharge material.

Figure 2:
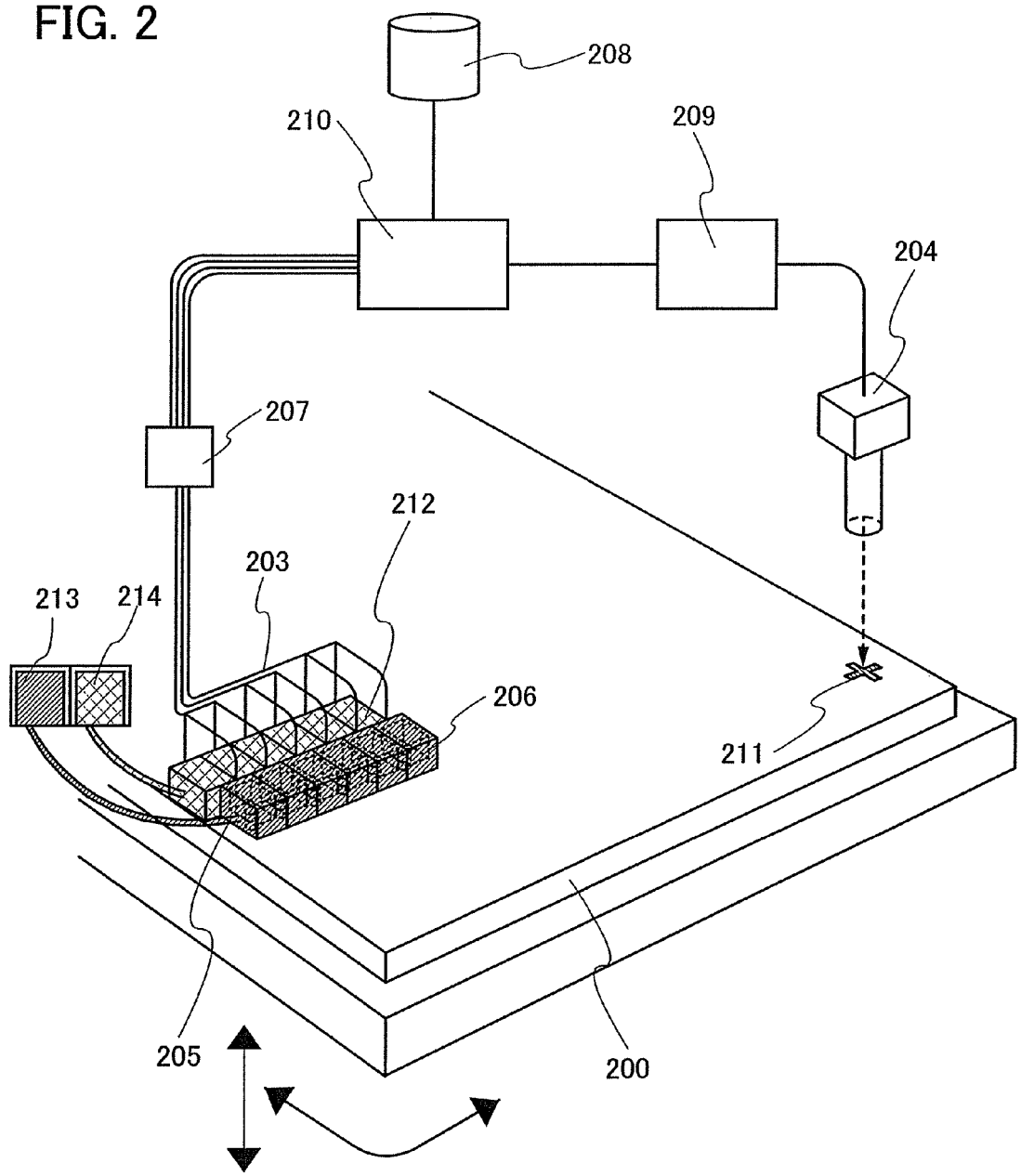
FIG. 2 is a view illustrating one mode of a droplet discharge apparatus.

One mode of a droplet discharge apparatus used for a droplet discharge method is illustrated in FIG. 2. Each of heads 205 and 212 of a droplet discharge means 203 is connected to a control means 207, and this control means 207 is controlled by a computer 210, so that a preprogrammed pattern can be drawn. The drawing timing may be determined, for example, based on a marker 211 that is formed over a substrate 200 over which a storage element provided. Alternatively, the edge of the substrate 200 may be used as the reference. The reference is detected by an imaging means 204, and converted into a digital signal by an image processing means 209. Then, the digital signal is recognized by the computer 210 and a control signal is generated, and the control signal is transmitted to the control means 207. An image sensor or the like using a charge coupled device (CCD) or a complementary metal oxide semiconductor can be used as the imaging means 204. Information on a pattern to be formed over the substrate 200 is stored in a storage medium 208, and the control signal is transmitted to the control means 207 based on the information, so that each of the heads 205 and 212 of the droplet discharge means 203 is individually controlled. The heads 205 and 212 are supplied with a material to be discharged, from material supply sources 213 and 214 respectively through pipes.

The head 205 has an internal structure which includes spaces filled with a liquid material as indicated by dotted lines 206 and nozzles which are outlets. Although not illustrated in the figure here, the head 212 has an internal structure similar to that of the head 205. For example, when the heads 205 and 212 have different nozzle sizes from each other, different materials with different widths can be discharged simultaneously. Needless to say, the same material can be discharged with different widths simultaneously.

When a large-sized substrate is used, the heads 205 and 212 can be freely scanned in directions indicated by the arrows in the figure, and a drawing region can be freely set. Therefore, a plurality of the same patterns can be drawn on one substrate. Alternatively, a drawing region may be freely set by moving a stage. Naturally, the heads and the stage may be moved simultaneously.

Note that the viscosity of a material to be discharged is preferably less than or equal to 20 mPa·s so that the material can be discharged from the nozzles smoothly. Further, the surface tension of the material to be discharged is preferably less than or equal to 40 mN/m. Note that the viscosity of the discharge material, or the like may be adjusted as appropriate in accordance with the solvent used, usage, or the like. For example, the viscosity of a discharge material in which nanoparticles of gold or silver are dispersed in a solvent may be greater than or equal to 5 mPa·s and less than or equal to 20 mPa·s.

Using such a droplet discharge apparatus, a discharge material in which nanoparticles of a conductive material are dispersed in a solvent is discharged onto a desired position, and then the solvent is vaporized by being dried. Note that the discharge material can de discharged onto a desired position; therefore, efficiency in the use of materials can be made high. FIG. 1B is a schematic view after the discharge material is dried. As illustrated in FIG. 1B, a substance other than the solvent, that is, nanoparticles 103 of a conductive material and an organic substance 104 which coats the nanoparticles 103 are left over the substrate 101. The substance left over the substrate 101, that is, the discharge material after drying, is also referred to as a discharge substance. Although the drying condition varies depending on a solvent which is used, for example, in a case where propanol is used for the solvent, drying may be performed at 100° C. for approximately 5 minutes. Note that the substrate 101 is heated at the time of the discharge; therefore, the time required for drying can also be reduced or omitted. In addition, there is a case where the solvent is left in the organic substance 104. Further, as described above, there is also a case where the discharge material contains a substance used for forming the nanoparticles (for example, a reduction agent), a binder, a plasticizer, a silane coupling agent, or the like. Therefore, there is also a case where the organic substance 104 contains these substances depending on a discharge material.

Note that the discharge material is discharged onto the substrate 110 by a droplet discharge method here; however, without limitation thereto, a printing method typified by screen printing can also be used by increasing the viscosity of the discharge material, for example.

Next, as pretreatment in a subsequent baking step, the discharge substance is exposed to active oxygen to decompose the organic substance 104. However, the organic substance 104 of all the nanoparticles 103 is not decomposed. Whether the organic substance 104 is decomposed or not differs depending on time of the pretreatment, a state in which the organic substance 104 and active oxygen are in contact, the kind of bonds of the organic substance 104, or the like. A baking temperature in a subsequent step can be reduced by at least performing the pretreatment by this active oxygen.

An example of a method for generating active oxygen is given. As shown in a formula (1), active oxygen $O(^1D)$ can be generated by ultraviolet irradiation on ozone. Note that h denotes a Planck constant and v denotes a frequency of an ultraviolet ray, and ultraviolet irradiation may be performed using an ultraviolet irradiation apparatus such as an ultraviolet lamp or a laser. Since ozone has a strong absorption band of a ultraviolet ray at a wavelength of greater than or equal to 200 nm and less than or equal to 300 nm, it is preferable to use a lamp, a laser, or the like that generates the wavelength efficiently for an ultraviolet irradiation apparatus.

$$O_3 + h\nu \rightarrow O_2 + O(^1D) \quad (1)$$

The pretreatment by the active oxygen may be performed by supply of active oxygen which is generated separately. Alternatively, the pretreatment may be performed by ultraviolet irradiation from the above discharge substance under an ozone atmosphere. How the pretreatment is performed differs whether the discharge substance is irradiated with an ultraviolet ray or not. The former is effective particularly when an element or the like is provided in a lower layer of a wiring where ultraviolet irradiation is not desired. On the other hand, when the latter is used, the bond of the organic substance 104 can be cut because an ultraviolet ray has high energy. Therefore, oxidation by the active oxygen is promoted; thus, the decomposition of the organic substance 104 in the pretreatment easily progresses. Accordingly, it is possible to reduce a baking temperature with pretreatment in shorter time. In this case, a low-pressure mercury lamp or an excimer lamp is preferably used for the ultraviolet irradiation apparatus. A low-pressure mercury lamp can generate an ultraviolet ray having a wavelength of 185 nm and 254 nm. On the other hand, an excimer lamp is a lamp utilizing light emission of an excimer, and a center wavelength thereof can be varied depending on the discharge gas to be used. As the discharge gas, mainly, a rare gas or a mixed gas of a rare gas and a halogen gas can be used, and particularly, an excimer lamp having a light emission center at a 172 nm wavelength in which xenon is used for the discharge gas is preferable. Energy of a 185 nm wavelength ultraviolet ray which is emitted from the low-pressure mercury lamp and a 172 nm wavelength ultraviolet ray which is emitted from the excimer lamp using xenon is often higher than various kinds of bond energy of the organic substance. Therefore, it is preferable to use the low-pressure mercury lamp or the excimer lamp as the ultraviolet irradiation apparatus.

Note that ozone may be generated by an ozone generation apparatus utilizing corona discharge or the like, or may be generated from oxygen. A method for generating ozone is described below. Oxygen in the air may be used as the oxygen. Alternatively, oxygen may also be supplied.

When irradiation with an ultraviolet ray having a wavelength of less than or equal to 240 nm (for example, a wavelength of 185 nm in the case of a low-pressure mercury lamp, and a wavelength of 172 nm in the case of an excimer lamp may be used) is performed in the presence of oxygen, ozone can be obtained from oxygen as shown in formulas (2) and (3). Note that $O(^3P)$ shows atomic oxygen in a ground state.

$$O_2 + h\nu \rightarrow O(^3P) + O(^3P) \quad (2)$$

$$O_2 + O(^3P) \rightarrow O_3 \quad (3)$$

Alternatively, when irradiation with light emission having a wavelength of less than or equal to 175 nm (for example, using an excimer lamp in which xenon is used as a discharge gas) is performed in the presence of oxygen, ozone and active oxygen can both be obtained from oxygen as shown in a formula (4). Thus, active oxygen can be obtained with high efficiency when an ultraviolet irradiation apparatus having light emission of such a wavelength is used. Accordingly, it is possible to reduce a baking temperature with a shorter pretreatment time. Needless to say, the atomic oxygen $O(^3P)$ which is obtained here is used to generate ozone (see formula (3)).

$$O_2 + h\nu \rightarrow O(^1D) + O(^3P) \quad (4)$$

For example, when the low-pressure mercury lamp is used for the ultraviolet irradiation apparatus, active oxygen is generated from ozone which is obtained by light emission having a 185 nm wavelength, with the use of light emission having a 254 nm wavelength, as shown in the formulas (2), (3), and (1). The organic substance 104 is decomposed with the use of the active oxygen thus obtained. Needless to say, the bond of the organic substance 104 is easily cut by light emission having a 185 nm wavelength particularly when the discharge substance is irradiated with the ultraviolet ray which is obtained from the low-pressure mercury lamp, as described above. Therefore, oxidation by the active oxygen is further promoted; thus, the decomposition of the organic substance 104 easily progresses in the pretreatment.

Furthermore, when the excimer lamp having a light emission center at a 172 nm wavelength in which xenon is used for discharge gas is used for the ultraviolet irradiation apparatus, active oxygen directly obtained from oxygen and active oxygen obtained from ozone which are obtained by light emission having a 172 nm wavelength as shown in the formulas (4), (3), and (1) are used to decompose the organic substance 104. Needless to say, the bond of the organic substance 104 is easily cut when the discharge substance is irradiated with light emission obtained from the above lamps; thus, oxidation by the active oxygen is further promoted. Accordingly, the decomposition of the organic substance 104 easily progresses in the pretreatment.

In addition, when active oxygen is not generated separately, ultraviolet irradiation is not necessarily performed from above the discharge substance. For example, ultraviolet irradiation may be performed from the side. Needless to say, irradiation is not limited to one place.

Figure 1C:
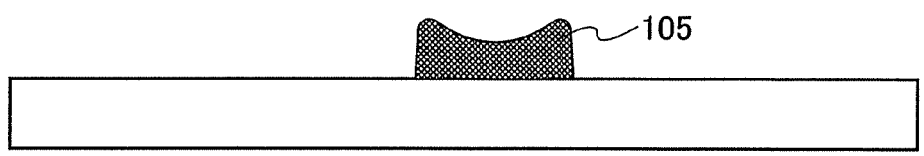

After the pretreatment by such active oxygen, a wiring 105 can be obtained by baking of the discharge substance, as illustrated in FIG. 1C. Note that the cross-sectional shape of the wiring 105 illustrated in FIG. 1C shows ring stain formed by the outward discharge substance at the time of vaporization of a solvent in the discharge material and the decomposition of the organic substance 104. However, a cross-sectional shape of a wiring to be obtained differs depending on conditions of performing drying, pretreatment, and baking, thereby not being limited to the shape thereto.

Further, a void may be generated between particles which are formed depending on a conductive material for forming the nanoparticles. This is because the crystal growth of the conductive material has progressed extremely quickly, and such a void can be suppressed with the use of an alloy material for the nanoparticles.

In a foregoing manner, a wiring can be simply formed at low cost.

Further, the case where the wiring is provided over the substrate 101 is described; however, the lower layer of the wiring is not particularly limited.

Note that a wiring is given as an example and a manufacturing method thereof is described in this embodiment mode; however, a conductive film can be formed in a similar manner. Further, a wiring may be formed by etching an obtained conductive film into a desired shape.

Further, the present invention is also effective in a case where a conductive layer is formed with the use of a coating method, which needs a baking step, such as spin coating. The conductive layer formed in such a manner is etched into a desired shape, whereby a wiring and a conductive film can be formed.

In a foregoing manner, a baking temperature at the time of forming a wiring and a conductive film can be reduced by pretreatment by active oxygen before baking. Further, the baking time can also be shortened. Furthermore, since efficiency in the use of materials is high depending on a kind of a coating method, a wiring and a conductive film having a desired shape can be simply formed at low cost. Moreover, since a high baking temperature is not needed, damage to other layers can be suppressed. Thus, it is possible to expand an application range of a coating method, which needs a baking step, as a method for manufacturing a wiring, a conductive film, and the like.

This embodiment mode can be combined with any of the description of other embodiment modes and embodiments as appropriate.

Embodiment Mode 2

Figure 3:
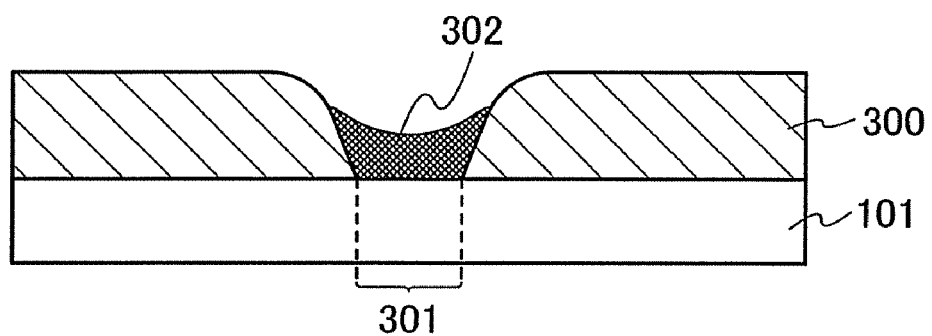
FIG. 3 is a view illustrating a method for manufacturing a wiring of the present invention.

This embodiment mode will describe a method for manufacturing a wiring, which is different from that in Embodiment Mode 1, with reference to FIG. 3.

First, partition walls (insulating layers) 300 are formed over a substrate 101 except a formation region of a wiring of the present invention (hereinafter simply referred to as a wiring formation region) 301, by a sputtering method, a CVD method, a printing method, a droplet discharge method, a spin coating method, an evaporation method, or the like. The partition walls (insulating layers) 300 can be formed using an inorganic insulating material such as silicon oxide, silicon nitride, or silicon oxynitride; acrylic acid, methacrylic acid, or a derivative thereof; a heat-resistant high-molecular material such as polyimide, aromatic polyamide, or polybenzimidazole; or a siloxane resin. Alternatively, a resin material, for example, a vinyl resin such as polyvinyl alcohol or polyvinyl butyral, an epoxy resin, a phenol resin, a novolac resin, an acrylic resin, a melamine resin, or a urethane resin may be used. Further alternatively, an organic material such as benzocyclobutene, parylene, fluorinated arylene ether, or polyimide; a composition containing a water-soluble homopolymer and a water-soluble copolymer, or the like may be used.

With the partition walls (insulating layers) 300 being provided, when a wiring 302 is formed by a droplet discharge method, a discharge material can be prevented from unnecessarily spreading from a desired portion, here, the wiring formation region 301.

Next, a discharge material in which nanoparticles of a conductive material are dispersed in a solvent is discharged onto the wiring formation region 301 by a droplet discharge method and then dried. Accordingly, the solvent is vaporized. Then, the discharge material is baked after pretreatment by active oxygen is performed in a similar manner to Embodiment Mode 1, whereby the wiring 302 can be obtained. By the pretreatment being performed, the baking temperature can be reduced.

Note that the pretreatment time is not particularly limited as long as the partition walls (insulating layers) 300 can withstand the pretreatment, and it is preferable to set the pretreatment time at greater than or equal to 30 seconds and less than or equal to 2 hours.

In a foregoing manner, a minute wiring can be formed simply. In addition, efficiency in the use of materials can also be improved.

In the meantime, the discharge material for forming the wiring is liquid and thus greatly affected by the surface condition of a region where the wiring is to be formed. Therefore, the partition walls (insulating layers) 300 may be subjected to treatment for controlling wettability. The wettability of the solid surface is affected by the chemical properties and the physical surface shape (surface roughness) of the surface. The treatment for controlling wettability of a surface in the present invention means to form regions having different wettability with respect to a liquid discharge material on a region where the discharge material is applied. Note that the regions having different wettability are regions having different wettability with respect to a discharge material, that is, regions having different contact angles with respect to a discharge material. A region having a larger contact angle with respect to a discharge material is a region having lower wettability than a discharge material (hereinafter also referred to as a low-wettability region), and a region having a smaller contact angle is a region having higher wettability than a discharge material (hereinafter also referred to as a high-wettability region).

When a contact angle is large, a liquid discharge material does not spread on a surface where the discharge material is applied, while the discharge material spreads when the contact angle is small. Thus, regions having different wettability have different surface energy. Surface energy is low in a region having low wettability but high in a region having high wettability.

Note that the difference in wettability is relative to each region. Here, a low-wettability region is formed on the partition walls (insulating layers) 300 which is the formation region of the wiring 302; thus, two kinds of regions having different wettability can be formed in the region where the discharge material is applied. As a method for selectively forming the low-wettability region, a method in which a layer containing a low-wettability substance is selectively formed by forming and using a mask layer, a method in which surface treatment is performed to selectively lower wettability, or the like can be used.

For example, as a method for changing and controlling surface wettability, there is a method in which wettability is changed by decomposition of a surface substance and modification of the region surface with the use of light irradiation energy. As the low-wettability substance, a substance containing a fluorocarbon group (a fluorocarbon chain), a substance containing a silane coupling agent, or the like can be used. The silane coupling agent can form a monomolecular film; therefore, surface modification can be efficiently performed and wettability can be changed in a short time, for example. Further, a silane coupling agent, which not only has a fluorocarbon group chain but also has an alkyl group, can exhibit low wettability by being arranged over a substrate. Furthermore, as the low-wettability substance, a titanate coupling agent or an aluminate coupling agent may also be used.

A liquid discharge material moves to a side where wettability is high; thus, a pattern, that is, the wiring can be formed in a more accurate position by the treatment for controlling wettability. Further, efficiency in the use of the discharge materials can be improved.

Note that the case where the partition walls (insulating layers) 300 are provided and the treatment for controlling wettability is performed is shown in this embodiment mode. However, as shown in Embodiment Mode 1, the treatment for controlling wettability may also be performed in the case where a wiring is provided over a substrate or the like. In addition, a lower layer of the wiring is not limited to the substrate.

In a foregoing manner, a wiring can be simply formed at low cost.

Note that a wiring is given as an example and a manufacturing method thereof is described in this embodiment mode; however, a conductive film can be formed in a similar manner. Further, a wiring may be formed by etching an obtained conductive film into a desired shape.

Further, the present invention is also effective in a case where a conductive layer is formed with the use of a coating method, which needs a baking step, such as spin coating. The conductive layer formed in such a manner is etched into a desired shape, whereby a wiring and a conductive film can be formed.

In a foregoing manner, a baking temperature at the time of forming a wiring and a conductive film can be reduced by pretreatment by active oxygen before baking. Further, the baking time can also be shortened. Furthermore, since efficiency in the use of materials is high depending on a kind of a coating method, a wiring and a conductive film having a desired shape can be simply formed at low cost. Moreover, since a high baking temperature is not needed, damage to other layers can be suppressed. Thus, it is possible to expand an application range of a coating method, which needs a baking step, as a method for manufacturing a wiring, a conductive film, and the like.

Note that this embodiment mode can be combined with any of the description of other embodiment modes and embodiments as appropriate.

Embodiment Mode 3

A structural example of a storage element which is formed using the present invention will be described with reference to FIGS. 4A to 4D.

Figure 4A:
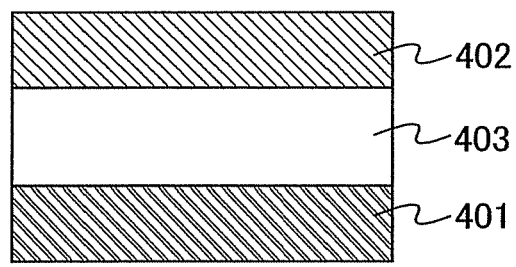
FIGS. 4A to 4D are views each illustrating one structural example of a storage element of the present invention.

A storage element illustrated in FIG. 4A includes a first conductive layer 401, a second conductive layer 402, and a memory layer 403 provided between the first conductive layer 401 and the second conductive layer 402. Here, a case where an organic compound layer is used as the memory layer 403 is described.

First, an operation mechanism of such a storage element is described. When voltage is applied between the first conductive layer 401 and the second conductive layer 402 of the storage element, a small amount of current flows through the memory layer 403, so that Joule heat is generated. Accordingly, the organic compound included in the memory layer 403 is deformed, and the first conductive layer 401 and the second conductive layer 402 are partially connected, that is to say, short-circuited. Thus, a high-resistance state of the memory layer 403 is shifted to a low-resistance state by predetermined voltage application, and a writing operation can be performed.

Next, materials that can be used for each layer are described.

For the first conductive layer 401, a metal, an alloy, a compound, or the like having high conductivity in a single-layer structure or a stacked-layer structure can be used. For example, a metal such as gold (Au), silver (Ag), platinum (Pt), nickel (Ni), tungsten (W), chromium (Cr), molybdenum (Mo), iron (Fe), cobalt (Co), copper (Cu), palladium (Pd), aluminum (Al), manganese (Mn), titanium (Ti), or tantalum (Ta); a nitride of such a metal material (for example, titanium nitride, tungsten nitride, or molybdenum nitride); besides a metal belonging to Group 1 or 2 of the periodic table, that is, an alkali metal such as lithium (Li) or cesium (Cs), an alkaline earth metal such as magnesium (Mg), calcium (Ca), or strontium (Sr); an alloy containing any of them (for example, Mg:Ag or Al:Li); or the like can be used. Alternatively, a rare earth metal such as europium (Er) or ytterbium (Yb), an alloy including any of them, or the like may be used. Further alternatively, indium tin oxide (hereinafter referred to as ITO), indium tin oxide containing silicon, indium oxide containing 2% to 20% [wt %] of zinc oxide (ZnO) (abbreviation: IZO), or the like can be used.

Note that the first conductive layer 401 is formed by an evaporation method, a sputtering method, a CVD method, a printing method, an electroplating method, an electroless plating method, a droplet discharge method, or the like. Needless to say, it is possible to use the present invention.

The organic compound layer used for the memory layer 403 is formed using an organic compound, a crystal state, conductivity, or a shape of which is changed by external voltage application. The organic compound layer may be provided in a single layer or a plurality of layers in which layers each formed of a different organic compound are stacked.

Note that the organic compound layer is formed with a thickness at which the electric resistance of the storage element is varied by external voltage application. A typical thickness of the organic compound layer is 5 to 100 nm, preferably 10 to 60 nm.

The organic compound layer can be formed using an organic compound having a hole-transporting property or an electron-transporting property.

For example, for an organic compound having a hole-transporting property, an aromatic amine compound (that is, a material with a benzene ring-nitrogen bond) such as 2,7-di (N-carbazolyl)-spiro-9,9'-bifluorene (abbreviation: SFDCz), 4,4'-bis[N-(1-napthyl)-N-phenylamino]biphenyl (abbreviation: NPB), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), or 4,4'-bis(N-(4-(N,N-di-m-tolylamino)phenyl)-N-phenylamino)biphenyl (abbreviation: DNTPD); a phthalocyanine compound such as phthalocyanine (abbreviation: $H_2Pc$), copper phthalocyanine (abbreviation: CuPc), or vanadyl phthalocyanine (abbreviation: VOPc); and the like can be given.

For an organic compound having a high electron-transporting property, a material formed of a metal complex that has a quinoline skeleton or benzoquinoline skeleton, such as tris(8-quinolinolato)aluminum (abbreviation: Alq), tris(4-methyl-8-quinolinolato)aluminum (abbreviation: $Almq_3$), bis(10-hydroxybenzo[h]quinolinato)beryllium (abbreviation: $BeBq_2$), or bis(2-methyl-8-quinolinolato)-4-phenylphenolato-aluminum (abbreviation: BAlq), or the like can be used. Alternatively, as well as these, a material of a metal complex that has an oxazole-based or thiazole-based ligand, such as bis[2-(2-hydroxyphenyl)benzoxazolato]zinc (abbreviation: Zn$(BOX)_2$), bis[2-(2-hydroxyphenyl)benzothiazolato]zinc (abbreviation: Zn$(BTZ)_2$), or the like can be used. Further alternatively, as well as metal complexes, 2-(4-biphenylyl)-5-(4-tert-butylphenyl)-1,3,4-oxadiazole (abbreviation: PBD), 1,3-bis[5-p-tert-butylphenyl)-1,3,4-oxadiazol-2-yl]benzene (abbreviation: OXD-7), 3-(4-biphenylyl)-4-phenyl-5-(4-tert-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and the like can be given.

In addition to the above, for example, the organic compound layer may be formed using 2,3-bis(4-diphenylaminophenyl)quinoxaline (abbreviation: TPAQn), 1,3,5-tri(N-carbazolyl)benzene (abbreviation: TCzB), 9-[4-(N-carbazolyl)phenyl]-10-phenylanthracene (abbreviation: CzPA), 3,6-diphenyl-9-[4-(10-phenyl-9-anthryl)phenyl]-9H-carbazole (abbreviation: DPCzPA), 2-t-butyl-9,10-bis(4-(N-carbazolyl)phenyl)anthracene (abbreviation: CzBPA), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), N-(2-naphthyl)carbazole (abbreviation: NCz), or the like.

The organic compound layer can be formed using an evaporation method, an electron-beam evaporation method, a sputtering method, a CVD method, or the like. In addition, for alternative methods, a spin coating method, a sol-gel method, a printing method, a droplet discharge method, or the like may be used, or the above methods may be combined with any of these methods.

In addition, in the organic compound layer, an insulator may be mixed into the organic compound having a hole-transporting property or an electron-transporting property. Note that the insulator does not have to be dispersed uniformly. Morphology of the organic compound layer can be improved by mixing the insulator into the organic compound. Thus, since partial crystallization or the like of the organic compound layer can be suppressed, variations in behavior of each storage element can be further suppressed.

As the insulator, an insulating inorganic or organic compound can be used. For example, as an inorganic compound, an oxide such as lithium oxide ($Li_2O$), sodium oxide ($Na_2O$), potassium oxide ($K_2O$), rubidium oxide ($Rb_2O$), beryllium oxide (BeO), magnesium oxide (MgO), calcium oxide (CaO), strontium oxide (SrO), or barium oxide (BaO), a fluoride such as lithium fluoride (LiF), sodium fluoride (NaF), potassium fluoride (KF), rubidium fluoride (RbF), beryllium fluoride ($BeF_2$), magnesium fluoride ($MgF_2$), calcium fluoride ($CaF_2$), strontium fluoride ($SrF_2$), or barium fluoride ($BaF_2$), an insulating nitride, chloride, bromide, iodide, carbonate, sulfate or nitrate, or the like can be used. Further, as an insulating organic compound, polyimide, an acrylic polymer, polyamide, a benzocyclobutene resin, polyester, a novolac resin, a melamine resin, a phenol resin, an epoxy resin, silicone resin, a furan resin, a diallyl phthalate resin, or the like can be used. Alternatively, a so-called siloxane-based material in which the main chain is formed from a bond of silicon and oxygen may be used.

Note that this kind of mixed layer can be formed by film formation of a plurality of materials simultaneously; for example, the mixed layer can be formed by the same method or a combination of different methods such as a co-evaporation method by resistance heating, a co-evaporation method by electron-beam evaporation, a co-evaporation method by resistance heating evaporation and electron-beam evaporation, film formation by resistance heating evaporation and a sputtering method, film formation by electron-beam evaporation and a sputtering method, or the like. Furthermore, for alternative formation methods, a spin coating method, a sol-gel method, a printing method, a droplet discharge method, or the like may be used, or one or more of these methods may be combined with any of the above methods. Alternatively, after the organic compound layer is formed, a mixed layer of an organic compound and insulator may be formed by introduction of the insulator by an ion implantation method, a doping method, or the like.

For the second conductive layer 402, a metal, an alloy, a compound, or the like having high conductivity in a single-layer structure or a stacked-layer structure can be used, similar to the first conductive layer 401. The second conductive layer 402 can be formed by an evaporation method, a sputtering method, a CVD method, a printing method, a droplet discharge method, or the like; however, it is preferable to use the present invention because the second conductive layer 402 is provided over the organic compound layer included in the memory layer 403.

First, as shown in Embodiment Mode 1, a discharge material, in which nanoparticles of a conductive material are dispersed in a solvent, is discharged by a droplet discharge method and then dried. Accordingly, the solvent is vaporized. Then, the discharge material is baked after pretreatment by active oxygen is performed, whereby the second conductive layer 402 can be obtained. By the pretreatment being performed, the baking temperature can be reduced. Thus, in this way the present invention is particularly effective in the case where high temperature treatment cannot be performed on the lower layer of the conductive layer.

Note that the storage element utilizes change in electric characteristics of the memory layer 403; therefore, initial characteristics of the memory layer 403 before voltage application largely effects characteristics of the storage element. It is particularly effective to form the storage element using the present invention, in which a high baking temperature is not necessary at the time of forming a conductive layer, and damage to other layers can be suppressed. In a foregoing manner, the second conductive layer 402 can be formed simply.

Figure 4B:
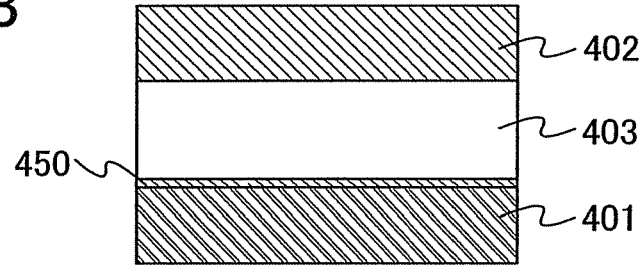

In addition, a structure of the storage element is not limited to FIG. 4A, and a structure illustrated in FIG. 4B may be employed. The storage element illustrated in FIG. 4B includes the first conductive layer 401, a layer 450, the memory layer 403, and the second conductive layer 402. The layer 450 and the memory layer 403 are provided between the first conductive layer 401 and the second conductive layer 402, and the memory layer 403 is formed in contact with the layer 450. Note that the thickness of the layer 450 is not particularly limited, and is preferably greater than or equal to 0.1 nm and less than or equal to 50 nm.

When an insulating layer is provided as illustrated in FIG. 4B, leakage current which would flow through an element, to which data has not been written when a read voltage is applied, can be reduced. Accordingly, power consumed at the time of reading can be reduced.

Note that write voltage with respect to the storage element of this embodiment mode can be reduced by making the memory layer 403 thinner. However, although the write voltage can be reduced when the memory layer 403 is thinned, leakage current caused at the time of reading would be increased when the thickness is too thin. In such a case, it is particularly effective to provide the insulating layer.

The insulating layer can be formed using an inorganic compound or an organic compound having insulating properties, and a material similar to the insulator, which may be mixed in the above organic compound layer, can be used. Note that the insulating layer used for the layer 450 can be formed by an evaporation method, a sputtering method, a CVD method, a printing method, a spin coating method, a sol-gel process, a droplet discharge method, or the like.

Further, the layer 450 may be a semiconductor layer, and can be formed using an inorganic semiconductor such as molybdenum oxide, tin oxide, bismuth oxide, silicon, vanadium oxide, nickel oxide, zinc oxide, silicon germanium, gallium arsenide, gallium nitride, indium oxide, indium phosphide, indium nitride, cadmium sulfide, cadmium telluride, or strontium titanate.

An evaporation method, a sputtering method, a CVD method, a printing method, a spin coating method, a sol-gel process, a droplet discharge method, or the like may also be used for the semiconductor layer.

Figure 4C:
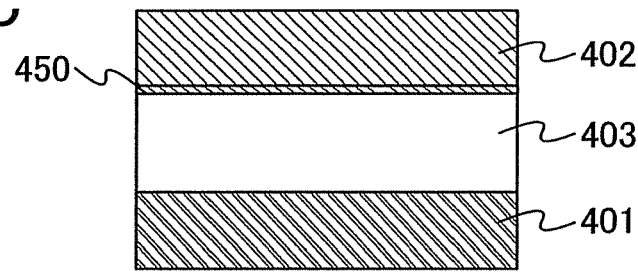
Figure 4D:
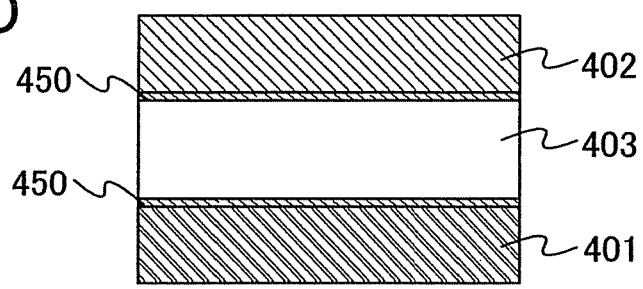

In addition, a structure of the storage element is not limited to FIG. 4B, and the layer 450 may be provided in contact with the second conductive layer 402 as in FIG. 4C. Moreover, as illustrated in FIG. 4D, two layers of the layers 450 may be provided to be in contact with the first conductive layer 401 and the second conductive layer 402.

Note that the case where the organic compound layer is used for the memory layer 403 is described in this embodiment mode; however, the memory layer 403 is not limited thereto as long as electric characteristics are changed by voltage application. Initial characteristics of the memory layer 403 effects largely on characteristics of the storage element; therefore, the present invention is effective even if the memory layer 403 is not formed of the organic compound layer.

In a foregoing manner, a highly reliable storage element can be simply formed at low cost with the use of the present invention.

Note that this embodiment mode can be combined with any of the description of other embodiment modes and embodiments as appropriate.

Embodiment Mode 4

In this embodiment mode, a structural example of a nonvolatile memory formed with the use of the present invention and a semiconductor device having the nonvolatile memory will be described.

Figure 5:
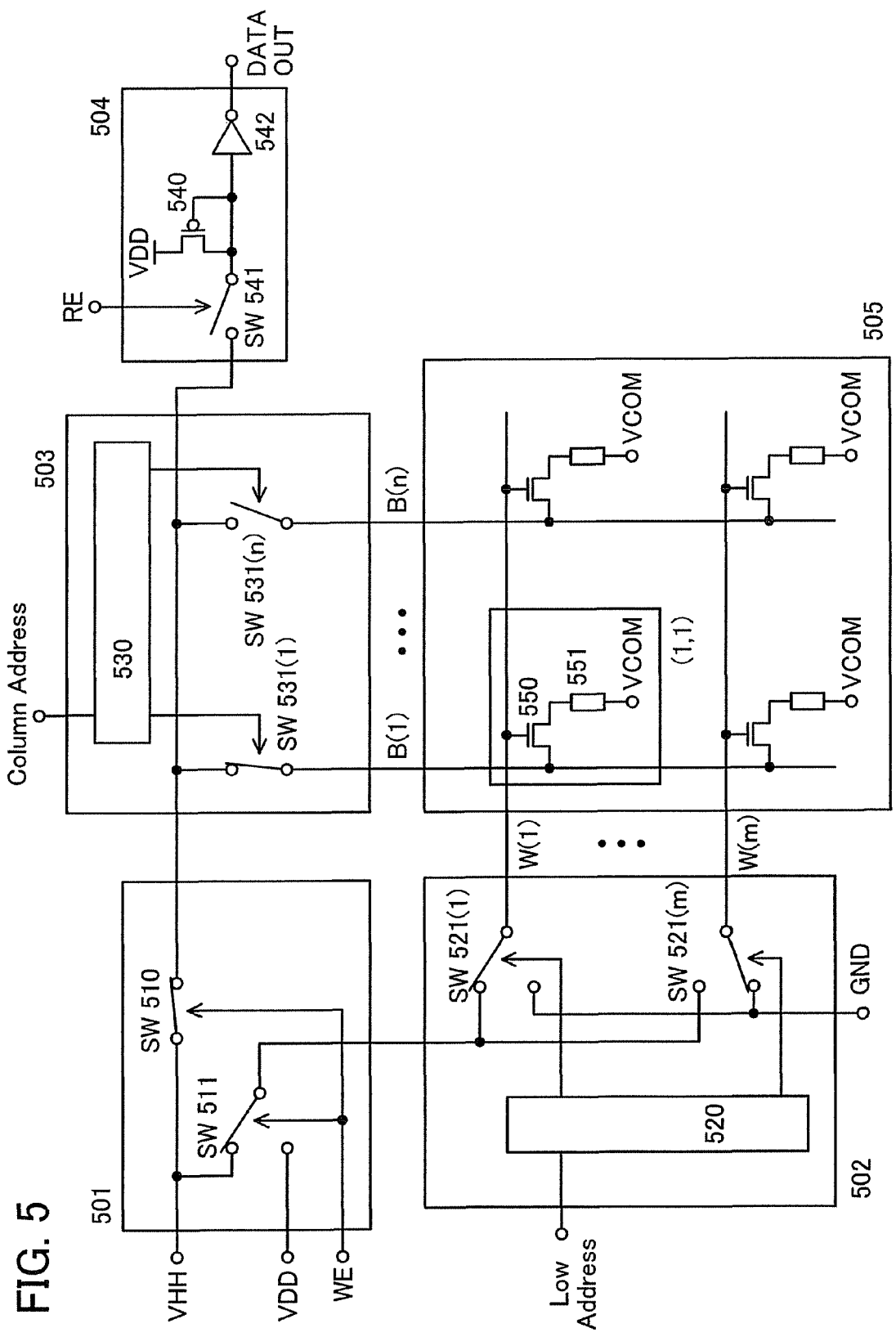
FIG. 5 is a diagram illustrating one structural example of a nonvolatile memory of the present invention.

First, a structural example of a nonvolatile memory manufactured with the use of the present invention is illustrated in FIG. 5. Note that a nonvolatile memory having the storage element shown in Embodiment Mode 3 is described here.

The nonvolatile memory illustrated in FIG. 5 includes a writing circuit 501, a word line driver circuit 502, a bit line driver circuit 503, a reading circuit 504, and a memory cell array 505 having memory cells that are arranged in row m and column n.

The bit line driver circuit 503 includes a column decoder 530 and switches 531(1) to 531(n), and a column address is inputted thereto. In addition, the bit line driver circuit 503 is connected to the memory cell array 505 by an n number of bit lines B(1) to B(n). The bit line driver circuit 503 turns on a switch 531(k) of a column that is specified by the column address (column k), and connects a bit line B(k) to the writing circuit 501 or the reading circuit 504.

The word line driver circuit 502 includes a row decoder 520 and switches 521(1) to 521(m), and a row address is inputted thereto. In addition, the word line driver circuit 502 is connected to the memory cell array 505 by an m number of word lines W(1) to W(m). The word line driver circuit 502 controls the switches 521(1) to 521(m), connects a word line W(j) of a row that is specified by the row address (row j) to the writing circuit 501, and connects a word line of another row to a ground power source line.

Note that the nonvolatile memory illustrated in FIG. 5 shows a state in which a memory cell (1, 1) is selected.

Memory cells (j, k) (j is an integer from 1 to m, and k is an integer from 1 to n) of the memory cell array 505 each include a transistor 550 and a storage element 551 which is formed using the present invention. A gate electrode of the transistor 550 is connected to the word line W(j), one of a source and drain electrodes of the transistor 550 is connected to the bit line B(k), and the other of the source and drain electrodes is connected to a first electrode of the storage element 551. In addition, a memory layer is provided between the first electrode and a second electrode of the storage element, and a common potential VCOM is supplied to the second electrode.

For the storage element 551, the storage element shown in Embodiment Mode 3 can be used. Thus, a storage element can be simply formed by the present invention. Further, since baking at a high temperature is not necessary in the present invention, damage to other layers can be suppressed.

The writing circuit 501 includes a switch 510 and a switch 511, and a power source potential VHH for writing, a power source potential VDD, and a writing control signal WE are inputted. When the signal WE is asserted, the switch 510 is turned on and the potential VHH is supplied to the bit line driver circuit 503. In addition, by the switch 511, the potential VHH is supplied to the word line driver circuit 502. On the other hand, when the signal WE is de-asserted, the switch 510 is turned off, and the potential VHH is not supplied to the bit line driver circuit 503. In addition, by the switch 511, the potential VDD is supplied to the word line driver circuit 502.

The signal WE is asserted and the signal RE is de-asserted at the time of writing. The bit line driver circuit 503 selects a column (column k) based on a column address, and supplies the potential VHH supplied from the writing circuit 501 to the bit line B(k). The word line driver circuit 502 selects a row (row j) based on a row address, and supplies the potential VHH supplied from the writing circuit 501 to the word line W(j). Then, writing is performed for a selected memory cell.

The reading circuit 504 includes a switch 541, a transistor 540, and an inverter 542, a reading control signal RE is inputted, and a signal DATA OUT is outputted. When the signal RE is asserted, the switch 541 is turned on, and the transistor 540 is electrically connected to the bit line driver circuit 503. As a result, a current in accordance with a state of a storage element in a selected memory cell is inputted to the reading circuit 504, and a potential of the signal DATA OUT is determined.

Specifically, the signal RE is asserted and the signal WE is de-asserted at the time of reading. The bit line driver circuit 503 selects a column (column k) based on a column address, and connects the reading circuit 504 and the bit line B(k). The word line driver circuit 502 selects a row (row j) based on a row address, and supplies the potential VDD, which is supplied from the writing circuit 501, to the word line W(j). Then, reading of a selected memory cell is performed.

If the storage element in the selected memory cell is in a low resistance state, a current that flows through the storage element becomes large, and a voltage drop at the transistor 540 also becomes large. Accordingly, an input potential to the inverter 542 becomes lower than a threshold potential of the inverter As a result, a potential of the signal DATA OUT becomes VDD. On the other hand, if the storage element in the selected memory cell is in a high resistance state, the current that flows into the storage element becomes small, and the voltage drop at the transistor 540 also becomes small. Accordingly, the input potential to the inverter 542 becomes higher than the threshold potential of the inverter. As a result, the potential of the signal DATA OUT becomes GND. In such a manner, by generation of the data signal DATA OUT based on a state of the storage element, whether the storage element is in a low resistance state or a high resistance state can be read.

Note that the switch 541 is turned off and reading of the memory cell is not performed in the case where the signal RE is de-asserted.

In a foregoing manner, a highly reliable nonvolatile memory can be simply provided at low cost according to the present invention. The storage element utilizes change in electric characteristics of the memory layer; therefore, initial characteristics of the memory layer before voltage application effect largely on characteristics of the storage element. It is particularly effective to form the storage element using the present invention, in which a high baking temperature is not necessary at the time of forming the electrode and damage to other layers can be suppressed. However, the application of the present invention is not limited to a storage element, and may be a conductive film such as a wiring and an electrode as shown in Embodiment Mode 1.

Figure 6:
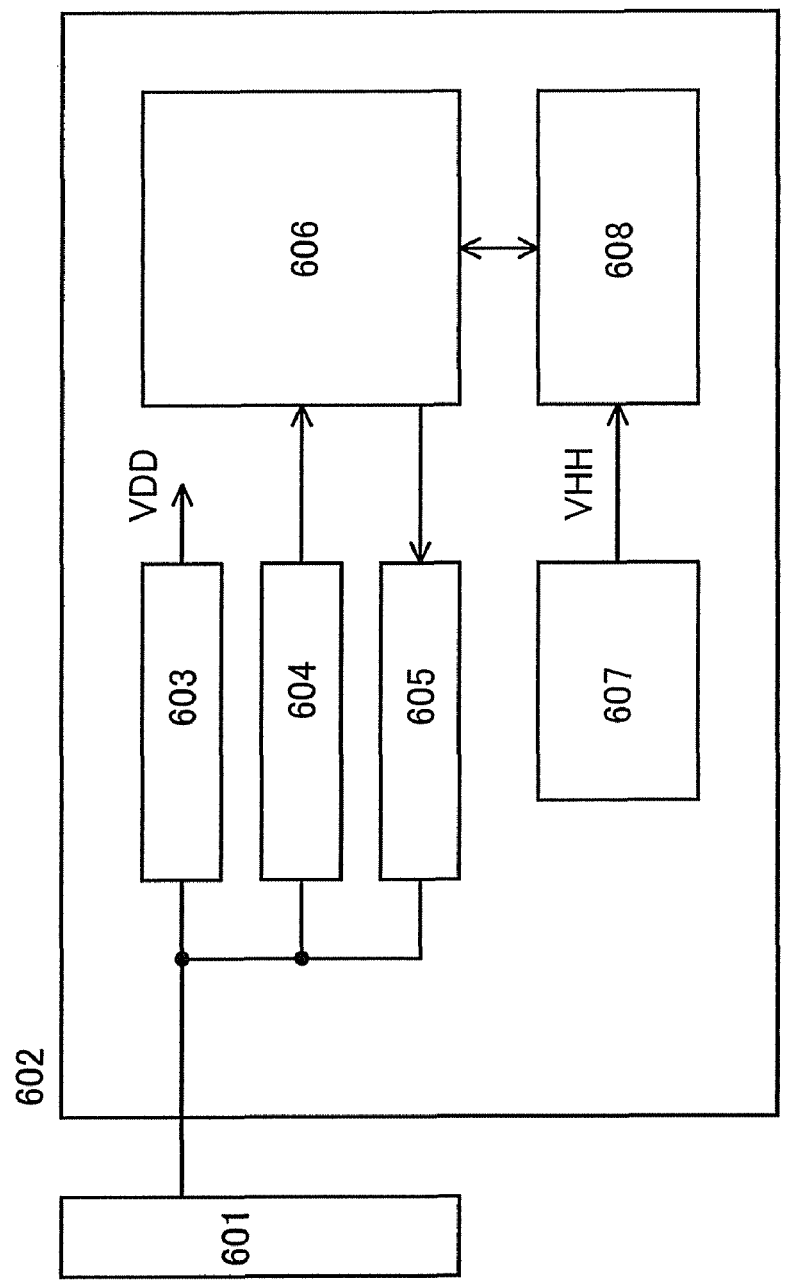
FIG. 6 is a diagram illustrating one structural example of a semiconductor device of the present invention.

Next, a structural example of a semiconductor device having the above nonvolatile memory is illustrated in the block diagram of FIG. 6.

The semiconductor device illustrated in FIG. 6 is a wireless tag including an antenna 601 and an IC chip 602. The IC chip 602 includes a power source circuit 603, a demodulation circuit 604, a modulation circuit 605, a logic circuit 606, a power source circuit 607, and a nonvolatile memory 608. In addition, the nonvolatile memory 608 has a plurality of storage elements.

The power source circuit 603 rectifies an AC signal inputted from the antenna 601, and generates a predetermined power source voltage VDD. The power source voltage VDD that is obtained is supplied to a circuit included in the IC chip 602. The demodulation circuit 604 extracts information from the AC signal inputted from the antenna 601 and outputs a demodulation signal. For example, in the case of amplitude modulation (ASK), a demodulation signal is generated by rectification and filtering. A modulation signal obtained from the logic circuit 606 is inputted to the modulation circuit 605, and impedance of the IC chip 602 is changed by load modulation or the like. Accordingly, the wireless tag transmits a response signal. Note that a clock signal and a demodulation signal are inputted to the logic circuit 606, and the logic circuit 606 outputs a modulation signal. In addition, the logic circuit 606 includes a decoding circuit; a command analysis portion; a checking circuit that checks consistency of received data; a memory control circuit; an output circuit that generates a modulation signal; and the like, and performs processing in accordance with a command that is received. In particular, the memory control circuit included in the logic circuit 606 controls reading and writing of the nonvolatile memory 608, or controls power source supply to the nonvolatile memory 608. The power source circuit 607 generates power source that is supplied to the nonvolatile memory 608 by the potential VDD. Specifically, the power source circuit 607 includes a boosting circuit, and generates a potential VHH that is supplied at the time of writing. With the use of the potential VHH, writing is performed on any or a plurality of storage elements included in the nonvolatile memory 608.

Note that for the antenna 601, an antenna of an electromagnetic induction method such as a coil antenna or a loop antenna; an antenna of an electric wave method such as a dipole antenna, a slit antenna, an inverted L antenna, or a patch antenna; or the like can be used.

In addition, "IC chip" is a generic name for a chip provided with an integrated circuit, and silicon, glass, plastic, paper, or the like can be used for a base of the integrated circuit. Alternatively, the IC chip 602 illustrated in FIG. 6 may be formed of a plurality of IC chips.

Although in FIG. 6, a structure is illustrated in which the antenna 601 is provided outside of the IC chip 602, the structure may be that in which the antenna 601 is incorporated into the IC chip 602. In addition, a communication method may be either an electric wave method or an electromagnetic induction method.

In a foregoing manner, a highly reliable semiconductor device can be simply provided at low cost according to the present invention. Note that the application of the present invention is not limited to a nonvolatile memory, and may be a conductive film such as a wiring and an electrode of other circuits.

Further, the active-matrix type nonvolatile memory having a transistor in each memory cell is described in this embodiment mode; however, a passive-matrix type nonvolatile memory in which a transistor is not needed in each memory cell may be used.

Note that this embodiment mode can be combined with any of the description of other embodiment modes and embodiments as appropriate.

Embodiment Mode 5

In this embodiment mode, an example of a method for manufacturing a semiconductor device of the present invention which is described in Embodiment Mode 4 will be described with reference to partial cross-sectional views.

First, as illustrated in FIG. 7A, a separation layer 703 is formed over one surface of a substrate 701 with an insulating film 702 interposed therebetween, and then an insulating film 704, which functions as a base film, and a semiconductor film (for example, a film containing amorphous silicon) 705 are stacked thereover. Note that the insulating film 702, the separation layer 703, the insulating film 704, and the semiconductor film 705 can be formed consecutively.

The substrate 1001 is selected from a glass substrate, a quartz substrate, a metal substrate (for example, a stainless steel substrate), a ceramic substrate, a semiconductor substrate such as a Si substrate, and the like. Alternatively, a plastic substrate made of polyethylene terephthalate (PET), polyethylene naphthalate (PEN), polyether sulfone (PES), acrylic, or the like can be used. In this process, although the separation layer 703 is provided over the entire surface of the substrate 701 with the insulating film 702 interposed therebetween, the separation layer 703 may also be selectively formed by a photolithography method after being provided over the entire surface of the substrate 701.

The insulating films 702 and 704 are each formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when each of the insulating films 702 and 704 is formed to have a two-layer structure, a silicon nitride oxide film may be formed as a first insulating film and a silicon oxynitride film may be formed as a second insulating film. Alternatively, a silicon nitride film may be formed as a first insulating film and a silicon oxide film may be formed as a second insulating film. The insulating film 702 functions as a blocking layer which prevents an impurity element contained in the substrate 701 from being mixed into the separation layer 703 or elements formed thereover. The insulating film 704 functions as a blocking layer which prevents an impurity element contained in the substrate 701 or the separation layer 703 from being mixed into elements formed over the insulating film 704. In this manner, the insulating films 702 and 704 which function as the blocking layers are provided, so that an alkali metal such as Na or an alkaline earth metal contained in the substrate 701 and the impurity element contained in the separation layer can be prevented from having an adverse effect on elements formed over the insulating film 704. Note that the insulating films 702 and 704 may be omitted when quartz is used for the substrate 701, for example.

The separation layer 703 can be formed using a metal film, a stacked-layer structure of a metal film and a metal oxide film, or the like. As a metal film, a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing such an element as its main component is formed in a single-layer structure or a stacked-layer structure. In addition, such materials can be formed by a sputtering method, various CVD methods such as a plasma CVD method, or the like. A stacked-layer structure of a metal film and a metal oxide film can be obtained in such a manner that, after forming the above metal film, plasma treatment is performed under an oxygen atmosphere or an $N_2O$ atmosphere or heat treatment is performed under an oxygen atmosphere or an $N_2O$ atmosphere, so that an oxide or oxynitride of the metal film can be formed on the surface of the metal film. For example, when a tungsten film is provided as a metal film by a sputtering method, a CVD method, or the like, a metal oxide film of tungsten oxide can be formed on the surface of the tungsten film by application of plasma treatment to the tungsten film. In this case, the tungsten oxide can be represented by $WO_x$ where x is in the range of 2 to 3. For example, there are cases where x is 2 ($WO_2$), x is 2.5 ($W_2O_5$), x is 2.75 ($W_4O_{11}$), x is 3 ($WO_3$), and the like. When tungsten oxide is formed, there is no particular limitation on the value of x, and thus, which of the above oxides is to be formed may be determined based on the etching rate or the like. Alternatively, after a metal film (for example, tungsten) is formed, an insulating film such as silicon oxide ($SiO_2$) may be formed over the metal film by a sputtering method, and also metal oxide (for example, tungsten oxide on tungsten) may be formed on the metal film. Moreover, high-density plasma treatment may be applied as the plasma treatment, for example. Besides the metal oxide film, metal nitride or metal oxynitride may also be formed. In this case, plasma treatment or heat treatment may be performed on the metal film under a nitrogen atmosphere or an atmosphere containing nitrogen and oxygen.

The semiconductor film 705 is formed with a thickness of 25 to 200 nm (preferably, 30 to 150 nm) by a sputtering method, an LPCVD method, a plasma CVD method, or the like.

Next, as illustrated in FIG. 7B, the semiconductor film 705 is crystallized by laser light irradiation. Alternatively, the crystallization of the semiconductor film 705 may be performed by a method combining the laser light irradiation with a thermal crystallization method using RTA or an annealing furnace or with a thermal crystallization method using a metal element that promotes the crystallization, or the like. After that, an obtained semiconductor film is etched into a desired shape, whereby semiconductor films 705a to 705f that are crystallized are formed. Then, a gate insulating film 706 is formed so as to cover the semiconductor films 705a to 705f.

The gate insulating film 706 is formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when the gate insulating film 706 is formed to have a two-layer structure, it is preferable to form a silicon oxynitride film as a first insulating film and form a silicon nitride oxide film as a second insulating film. Alternatively, it is also preferable to form a silicon oxide film as a first insulating film and form a silicon nitride film as a second insulating film.

An example of a manufacturing process of the semiconductor films 705a to 705f is briefly described below. First, an amorphous semiconductor film having a thickness of 50 to 60 nm is formed by a plasma CVD method. Then, a solution containing nickel which is a metal element that promotes crystallization is retained on the amorphous semiconductor film, which is followed by dehydrogenation treatment (at 500° C. for one hour) and thermal crystallization treatment (at 550° C. for four hours) which are performed on the amorphous semiconductor film. Thus, a crystalline semiconductor film is formed. Then, the crystalline semiconductor film is subjected to laser light irradiation and then the semiconductor films 705a to 705f that are crystallized are formed using a photolithography method. Note that crystallization of the amorphous semiconductor film may be performed only by laser light irradiation, not by thermal crystallization which uses a metal element that promotes crystallization.

Note that a continuous wave laser (a CW laser) or a pulsed laser can be used as a laser oscillator used for crystallization. As a laser that can be used here, there are gas lasers such as an Ar laser, a Kr laser, and an excimer laser; a laser, a medium of which is single-crystal YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When irradiation is performed with the fundamental wave of such a laser beam or the second to fourth harmonics of the fundamental wave, crystals with a large grain size can be obtained. For example, the second harmonic (532 nm) or the third harmonic (355 nm) of an Nd:YVO$_4$ laser (the fundamental wave of 1064 nm) can be used. In this case, a laser power density of approximately 0.01 to 100 MW/cm$^2$ (preferably, 0.1 to 10 MW/cm$^2$) is needed, and irradiation is performed with a scanning rate of approximately 10 to 2000 cm/sec. Note that the laser, a medium of which is single crystal YAG YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser, or a Ti:sapphire laser, can be used as a CW laser, whereas it can also be used as a pulsed laser with a repetition rate of 10 MHz or more by a Q-switch operation, mode locking, or the like. When a laser beam with a repetition rate of 10 MHz or more is used, a semiconductor film is irradiated with the next pulse during the period in which the semiconductor film has been melted by the laser beam and is solidified. Therefore, unlike the case of using a pulsed laser with a low repetition rate, a solid-liquid interface in the semiconductor film can be continuously moved. Thus, crystal grains which have grown continuously in the scanning direction can be obtained.

The gate insulating film 706 may be formed by oxidization or nitridation of the surfaces of the semiconductor films 705a to 705f by high-density plasma treatment. For example, plasma treatment with a mixed gas of a rare gas such as He, Ar, Kr, or Xe, and oxygen, nitrogen oxide (NO$_2$), ammonia, nitrogen, or hydrogen is performed. When plasma is excited by the introduction of microwaves, plasma with a low electron temperature and high density can be generated. With oxygen radicals (which may include OH radicals) or nitrogen radicals (which may include NH radicals) which are generated by the high-density plasma, the surfaces of the semiconductor films can be oxidized or nitrided.

By such high-density plasma treatment, an insulating film having a thickness of 1 to 20 nm, typically 5 to 10 nm, is formed on the semiconductor films. Since the reaction in this case is a solid-phase reaction, the interface state density between the insulating film and the semiconductor films can be quite low. Since such high-density plasma treatment directly oxidizes (or nitrides) the semiconductor films (crystalline silicon or polycrystalline silicon), desirably, the insulating film can be formed with extremely little unevenness. In addition, since crystal grain boundaries of crystalline silicon are not strongly oxidized, an excellent state is obtained. That is, by the solid-phase oxidation of the surfaces of the semiconductor films by high-density plasma treatment which is described here, an insulating film with a uniform thickness and low interface state density can be formed without excessive oxidation reaction at the crystal grain boundaries.

Note that as the gate insulating film 706, only an insulating film formed by high-density plasma treatment is used, or a stacked-layer structure may be employed, which is obtained by deposition of an insulating film such as silicon oxide, silicon oxynitride, or silicon nitride over the insulating film, by a CVD method using plasma or thermal reaction. Needless to say, insulating layers of silicon oxide, silicon oxynitride, silicon nitride, and the like may be deposited by a CVD method, and then the films may be subjected to high-density plasma treatment. In either case, a transistor which includes such an insulating film formed by high-density plasma treatment in part or the whole of its gate insulating film can reduce characteristic variations.

In addition, the semiconductor films 705a to 705f, which are obtained by irradiation with a continuous wave laser beam or a laser beam oscillated with a repetition rate of 10 MHz or more to a semiconductor film and scanning of the semiconductor film with the laser beam in one direction to crystallize the semiconductor film, have a characteristic in that their crystals grow in the beam scanning direction. Transistors are each arranged so that its channel length direction (direction in which carriers move when a channel formation region is formed) is aligned with the scanning direction, and the above gate insulating film is combined with the semiconductor film, whereby thin film transistors (TFTs) with high electron field effect mobility and reduced variations in characteristics can be obtained.

Next, a first conductive film and a second conductive film are stacked over the gate insulating film 706. Here, the first conductive film is formed with a thickness of 20 to 100 nm by a CVD method, a sputtering method, or the like. The second conductive film is formed with a thickness of 100 to 400 nm. The first conductive film and the second conductive film are each formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component. Alternatively, the first conductive film and the second conductive film may each be formed of a semiconductor material typified by polycrystalline silicon doped with an impurity element such as phosphorus. As combination examples of the first conductive film and the second conductive film, a tantalum nitride film and a tungsten film; a tungsten nitride film and a tungsten film; a molybdenum nitride film and a molybdenum film; and the like can be given. Tungsten and tantalum nitride have high heat resistance. Therefore, after the first conductive film and the second conductive film are formed, thermal treatment for the purpose of heat activation can be applied thereto. In addition, in the case of not a two-layer structure but a three-layer structure, a stacked-layer structure of a molybdenum film, an aluminum film, and a molybdenum film may be employed.

Next, a resist mask is formed by a photolithography method, and etching treatment is performed to form gate electrodes and gate lines. Thus, gate electrodes 707 are formed above the semiconductor films 705a to 705f. Here, a stacked-layer structure of a first conductive film 707a and a second conductive film 707b is shown as an example of the gate electrode 707. However, the number of stacked layers is not particularly limited.

Next, as illustrated in FIG. 7C, an impurity element imparting n-type conductivity is added into the semiconductor films 705a to 705f at low concentration by an ion doping method or an ion implantation method, using the gate electrodes 707 as masks. Then, a resist mask is selectively formed by a photolithography method, and an impurity element imparting p-type conductivity is added into the semiconductor films 705c and 705e at high concentration. As an impurity element imparting n-type conductivity, phosphorus (P), arsenic (As), or the like can be used. As an impurity element imparting p-type conductivity, boron (B), aluminum (Al), gallium (Ga), or the like can be used. Here, phosphorus (P) is used as an impurity element imparting n-type conductivity and is selectively introduced into the semiconductor films 705a to 705f so as to be contained at concentrations of $1\times10^{15}$ to $1\times10^{19}/cm^3$. Thus, impurity regions 708 showing n-type conductivity are formed. In addition, boron (B) is used as an impurity element imparting p-type conductivity, and is selectively introduced into the semiconductor films 705c and 705e so as to be contained at concentrations of $1\times10^{19}$ to $1\times10^{20}/cm^3$. Thus, impurity regions 709 showing p-type conductivity are formed.

Subsequently, an insulating film is formed so as to cover the gate insulating film 706 and the gate electrodes 707. The insulating film is formed of a film containing an inorganic material such as silicon, an oxide of silicon, or a nitride of silicon, or a film containing an organic material such as an organic resin in a single-layer structure or a stacked-layer structure by a plasma CVD method, a sputtering method, or the like. Next, the insulating film is selectively etched by anisotropic etching mainly in the perpendicular direction, so that insulating films 710 (also referred to as sidewalls) which are in contact with the side surfaces of the gate electrodes 707 are formed. The insulating films 710 are used as masks for doping in forming lightly doped drain (LDD) regions.

Next, an impurity element imparting n-type conductivity is added into the semiconductor films 705a, 705b, 705d, and 705f at high concentration, using resist masks formed by a photolithography method, the gate electrodes 707, and the insulating films 710 as masks. Thus, impurity regions 711 showing n-type conductivity are formed. Here, phosphorus (P) is used as an impurity element imparting n-type conductivity, and is selectively introduced into the semiconductor films 705a, 705b, 705d, and 705f so as to be contained at concentrations of $1\times10^{19}$ to $1\times10^{20}/cm^3$. Thus, the impurity regions 711, showing n-type conductivity having impurity concentrations which are higher than that of the impurity regions 708, are formed.

Through the above steps, n-channel thin film transistors 700a, 700b, 700d, and 700f, and p-channel thin film transistors 700c and 700e are formed, as illustrated in FIG. 7D. Note that here, the thin film transistors 700a and 700b are thin film transistors that are used in a memory cell array portion of a nonvolatile memory of the present invention, and the thin film transistors 700c to 700e show other thin film transistors that are included in a semiconductor device. Note that the thin film transistors 700a and 700b used in the memory cell array portion of the nonvolatile memory and part of the transistors used during writing are applied with a higher potential than other transistors. Accordingly, they are preferably transistors with high withstand voltage. Therefore, at least a channel length L of each of the thin film transistors 700a and 700b may be longer than channel lengths of other transistors. Needless to say, the thin film transistors 700c to 700e can also be used as thin film transistors included in the nonvolatile memory.

Note that in the n-channel thin film transistor 700a, a channel formation region is formed in a region of the semiconductor film 705a which overlaps with the gate electrode 707; the impurity regions 711 serving as source and drain regions are formed in regions of the semiconductor film 705a which do not overlap with the gate electrode 707 and the insulating film 710; and low concentration impurity regions (LDD regions) are formed in regions of the semiconductor film 705a which overlap with the insulating film 710, between the channel formation region and the impurity regions 711. Similarly, channel formation regions, low concentration impurity regions, and the impurity regions 711 are formed in the n-channel thin film transistors 700b, 700d, and 700f.

In the p-channel thin film transistor 700c, a channel formation region is formed in a region of the semiconductor film 705c which overlaps with the gate electrode 707, and the impurity regions 709 serving as source and drain regions are formed in regions of the semiconductor film 705c which do not overlap with the gate electrode 707. Similarly, a channel formation region and the impurity regions 709 are formed in the p-channel thin film transistor 700e. Here, although LDD regions are not formed in the p-channel thin film transistors 700c and 700e, LDD regions may be provided in the p-channel thin film transistors or a structure without LDD regions may be applied to the n-channel thin film transistors.

Next, as illustrated in FIG. 8A, an insulating film is formed in a single-layer structure or a stacked-layer structure so as to cover the semiconductor films 705a to 705f, the gate electrodes 707, and the like. Then, conductive films 713 electrically connected to the impurity regions 709 and 711 which form the source and drain regions of the thin film transistors 700a to 700f are formed over the insulating film. The insulating film is formed in a single-layer structure or a stacked-layer structure, using an inorganic material such as an oxide of silicon or a nitride of silicon, an organic material such as polyimide, polyamide, benzocyclobutene, acrylic, or epoxy, a siloxane material, or the like by a CVD method, a sputtering method, an SOG method, a droplet discharge method, a screen printing method, or the like. Here, the insulating film is formed to have a two-layer structure, and a silicon nitride oxide film is formed as a first insulating film 712a and a silicon oxynitride film is formed as a second insulating film 712b. In addition, the conductive films 713 can form the source and drain electrodes of the thin film transistors 700a to 700f.

Before the insulating films 712a and 712b are formed or after one of or both the insulating films 712a and 712b are formed, heat treatment is preferably performed for recovery of the crystallinity of the semiconductor films, activation of the impurity element which has been added into the semiconductor films, or hydrogenation of the semiconductor films. As the heat treatment, thermal annealing, a laser annealing method, an RTA method, or the like may be applied.

Further, the conductive films 713 are formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component in a single-layer structure or a stacked-layer structure by a CVD method, a sputtering method or the like. An alloy material containing aluminum as its main component corresponds to, for example, a material which contains aluminum as its main component and also contains nickel, or a material which contains aluminum as its main component, and also contains nickel and one of or both carbon and silicon. The conductive films 713 may be formed to have a stacked-layer structure of a barrier film, an aluminum-silicon (Al—Si) film, and a barrier film or a stacked-layer structure of a barrier film, an aluminum silicon (Al—Si) film, a titanium nitride film, and a barrier film. Note that the "barrier film" corresponds to a thin film formed of titanium, a nitride of titanium, molybdenum, or a nitride of molybdenum. Aluminum and aluminum silicon are suitable materials for forming the conductive films 713 because they have low resistance and are inexpensive. When barrier layers are provided as the top layer and the bottom layer, generation of hillocks of aluminum or aluminum silicon can be prevented. In addition, when a barrier film formed of titanium which is an element having a high reducing property is formed, even when there is a thin natural oxide film formed on a semiconductor film, the natural oxide film can be chemically reduced, and a favorable contact between the conductive film 713 and the semiconductor film can be obtained.

Next, an insulating film 714 is formed so as to cover the conductive films 713, and conductive films 715a and 715b are formed over the insulating film 714 so as to be electrically connected to the conductive films 713 each forming a source or drain electrode of a thin film transistor. In FIG. 8B, the conductive films 715a are illustrated as conductive films that are electrically connected to the conductive films 713 each forming a source or drain electrode of each of the thin film transistor 700a and the thin film transistor 700b included in a memory cell array portion. Further, in FIG. 8B, the conductive film 715b is illustrated as a conductive film that is electrically connected to the conductive film 713 forming a source or drain electrode of the thin film transistor 700f. Note that the conductive films 715a function as first electrodes of storage elements that are formed later. Further, the conductive film 715b functions as a base film of an antenna that is formed later. With the conductive film 715b, connection between the thin film transistor 700f and the antenna can be more secure, and adhesion between the insulating film 714 and the antenna can be improved as well. The conductive films 715a and the conductive film 715b can be formed using any of the materials described for the conductive film 713 above.

Note that the insulating film 714 can be formed of an insulating film containing oxygen and/or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as diamond-like carbon (DLC); an organic material such as epoxy, polyimide, polyamide, polyvinyl phenol, benzocyclobutene, or acrylic; or a siloxane material such as a siloxane resin in a single-layer structure or a stacked-layer structure by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (for example, an alkyl group or aromatic hydrocarbon) is used. Alternatively, a fluoro group may be used as the substituent. Further alternatively, a fluoro group and an organic group containing at least hydrogen may be used as the substituent.

Next, in order to separate storage elements included in the nonvolatile memory portion from each other, a partition wall (insulating layer) 716 is formed between first electrodes of neighboring storage elements. Note that in a cross-section of the partition wall (insulating layer) 716, it is preferable that a side surface of each partition wall (insulating layer) 716 has an angle of gradient that is more than or equal to 10 degrees and less than 60 degrees, and preferably more than or equal to 25 degrees and less than or equal to 45 degrees, with respect to a surface of the first electrode. Further, a surface of each partition wall 716 preferably has a curve.

Note that for the partition walls (insulating layers) 716, an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular compound such as polyimide, aromatic polyamide, or polybenzimidazole; or a siloxane material can be used. Alternatively, a resin material such as a vinyl resin such as polyvinyl alcohol or polyvinyl butyral; an epoxy resin; a phenol resin; a novolac resin; an acrylic resin; a melamine resin; or a urethane resin can be used. Further alternatively, an organic material such as benzocyclobutene, parylene, or polyimide; a compound material made by polymerization; or a composition material containing a water-soluble homopolymer and a water-soluble copolymer; or the like may be used. As a manufacturing method, a CVD method, a sputtering method, a droplet discharge method, a dispenser method, a printing method, or the like can be used. Alternatively, a thin film obtained by a spin-coating method or the like can be used.

Next, a conductive film 721, which functions as an antenna that is electrically connected to the conductive film 715b, is formed.

The conductive film 721 is formed by a CVD method, a sputtering method, a printing method such as screen printing or gravure printing, a droplet discharge method, a dispenser method, a plating method, or the like, using a conductive material. The conductive material is formed of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or compound material containing the element as its main component in a single-layer structure or a stacked-layer structure.

Next, storage elements included in the memory cell array portion are formed. First, a memory layer 717 is formed over the partition walls (insulating layers) 716 and the first electrodes of the storage elements, that is, the conductive films 715a. Here, an example in which an organic compound layer is used as the memory layer 717 is described. Such an element has a property of partially connecting a first electrode and a second electrode, that is, a property of a short circuit by voltage application, as shown in Embodiment Mode 3. Accordingly, by application of a predetermined voltage to each storage element, the storage element can shift from a high-resistance state to a low-resistance state, and a writing operation can be performed. Note that a substance similar to that in Embodiment Mode 3 can be used for each material which forms the storage element.

In addition, the organic compound layer which is used for the memory layer 717 can be formed using an evaporation method, an electron-beam evaporation method, a sputtering method, a CVD method, or the like.

Next, a conductive film 718, which functions as a second electrode, is formed over the memory layer 717. In a lower layer of the conductive film 718, there is a layer, high-temperature treatment of which is concerned, such as the memory layer 717. Therefore, the conductive film 718 is preferably formed using the present invention. Specifically, a discharge material in which nanoparticles of a conductive material are dispersed in a solvent is discharged by a droplet discharge method or the like and then dried. Accordingly, the solvent is vaporized. Then, the discharge material is baked after pretreatment by active oxygen is performed, whereby the second electrode of the storage element can be obtained. By the pretreatment being performed, the baking temperature can be reduced. Thus, damage to other layers such as the memory layer 717 in forming the conductive film 718 can be suppressed.

Note that a generation method or the like of active oxygen described in Embodiment Mode 1 can be used; however, ultraviolet irradiation is preferably performed from the side in generating active oxygen simultaneously as the pretreatment. The irradiation from the side can prevent the semiconductor films of the thin film transistors 700a to 700f from being irradiated with an ultraviolet ray. Thus, deterioration of the transistors due to an ultraviolet ray at the time of manufacturing can be prevented.

In a foregoing manner, storage elements 719a and 719b including the conductive films 715a, which each function as the first electrode, the memory layer 717, and the conductive film 718, which function as the second electrode, can be formed simply. Note that these storage elements are separated from each other by the partition walls (insulating layers) 716. Accordingly, not only an effect of an electric field to a neighboring storage element can be prevented, but a break in the memory layer 717 that occurs due to a step of the conductive film 715a in providing the memory layer 717 can be prevented with the use of the partition walls (insulating layers) 716. Note that the partition walls (insulating layers) 716 do not necessarily provided in particular in the case of a structure in which the neighboring storage elements 719a and 719b can be separated from each other without providing the partition walls (insulating layers) 716.

Next, as illustrated in FIG. 8C, after an insulating film 722 is formed so as to cover the conductive film 721 and the storage elements 719a and 719b, a layer including the thin film transistors 700a to 700f, the conductive film 721, the storage elements 719a and 719b, and the like (hereinafter referred to as an "element formation layer 10") is separated from the substrate 701. Here, after an opening is formed in the element formation layer 10 by laser light irradiation (for example, an ultraviolet ray), excluding the region of the thin film transistors 700a to 700f, the element formation layer 10 can be separated from the substrate 701 with physical force. The separation layer 703 may be selectively removed by introduction of an etchant into the opening, which is formed, before the element formation layer 10 is separated from the substrate 701. As the etchant, a gas or a liquid containing halogen fluoride or an interhalogen compound is used. For example, when chlorine trifluoride ($ClF_3$) is used as the gas containing halogen fluoride, the element formation layer 10 is separated from the substrate 701. The whole separation layer 703 is not removed but part thereof may be left. Accordingly, the consumption of the etchant can be suppressed and treatment time for removing the separation layer can be shortened. Further, even after the separation layer 703 is removed, the element formation layer 10 can be held above the substrate 701. In addition, by reuse of the substrate 701 from which the element formation layer 10 has been separated, cost can be reduced.

The insulating film 722 can be formed of an insulating film containing oxygen and/or nitrogen such as silicon oxide ($SiO_x$), silicon nitride ($SiN_x$), silicon oxynitride ($SiO_xN_y$ where x>y>0), or silicon nitride oxide ($SiN_xO_y$ where x>y>0); a film containing carbon such as diamond-like carbon (DLC); an organic material such as epoxy, polyimide, polyamide, polyvinyl phenol, benzocyclobutene, or acrylic; or a siloxane material such as a siloxane resin in a single-layer structure or a stacked-layer structure by a CVD method, a sputtering method, or the like.

In this embodiment mode, as illustrated in FIG. 9A, after the opening is formed in the element formation layer 10 by laser light irradiation, a first sheet material 723 is attached to one surface of the element formation layer 10 (a surface where the insulating film 722 is exposed), and then the element formation layer 10 is separated from the substrate 701.

Next, as illustrated in FIG. 9B, a second sheet material 724 is attached to the other surface of the element formation layer 10 (the surface exposed by separation) by one of or both heat treatment and pressure treatment. Note that a hot-melt film or the like can be used as the first sheet material 723 and the second sheet material 724.

As the first sheet material 723 and the second sheet material 724, a film on which antistatic treatment for preventing static electricity or the like has been applied (hereinafter referred to as an antistatic film) can be used. As examples of the antistatic film, a film in which an antistatic material is dispersed in a resin, a film to which an antistatic material is attached, and the like can be given. The film provided with an antistatic material can be a film with an antistatic material provided on one of its surfaces, or a film with an antistatic material provided on each of its surfaces. The film with an antistatic material provided on one of its surfaces may be attached to the layer so that the antistatic material is placed on the inner side of the film or the outer side of the film. The antistatic material may be provided for the entire surface of the film, or over part of the film. As an antistatic material here, a metal, indium tin oxide (ITO), or a surfactant such as an amphoteric surfactant, a cationic surfactant, or a nonionic surfactant can be used. Alternatively, as an antistatic material, a resin material which contains a cross-linked copolymer having a carboxyl group and a quaternary ammonium base on its side chain, or the like can be used. Such a material is attached, mixed, or applied to a film, so that an antistatic film can be formed. The element formation layer is sealed using the antistatic film, so that the semiconductor elements can be protected from adverse effects such as external static electricity when dealt with as a commercial product.

By the foregoing steps, a highly reliable semiconductor device can be simply provided at low cost according to the present invention. Note that an example in which the antenna is formed over the same substrate as the thin film transistors is described in this embodiment mode; however, the present invention is not limited to this structure. The thin film transistors and the antenna may be electrically connected by attaching, using a resin containing conductive particles, a first substrate over which a layer including the thin film transistors are formed and a second substrate over which a conductive layer, which function as the antenna, is formed.

Alternatively, although a step of forming elements such as thin film transistors over a substrate and then separating them afterwards is shown, separation does not have to be performed and the substrate with elements formed thereover may be a product as is. Further, after elements such as thin film transistors are provided over a glass substrate, the glass substrate is polished from a side opposite to a side over which the elements are provided, so that a semiconductor device can be reduced in thickness and size.

Further, an example in which the second electrode of the storage element included in the nonvolatile memory is formed according to the present invention is described in this embodiment mode; however, the present invention is not limited thereto. Alternatively, the present invention can be applied to a conductive film such as a wiring, an electrode, and an antenna.

Note that this embodiment mode can be combined with any of the description of other embodiment modes and embodiments as appropriate.

Embodiment Mode 6

In this embodiment mode, a method for manufacturing a transistor included in a semiconductor device or a nonvolatile memory of the present invention, which is different from the above embodiment modes, will be described with reference to partial cross-sectional views illustrated in FIGS. 10A to 10C, 11A to 11C, and 12. The transistor included in the semiconductor device or the nonvolatile memory of the present invention may be a MOS transistor over a single-crystal substrate, other than a thin film transistor over an insulating substrate as described in the above embodiment mode.

Figure 10A:
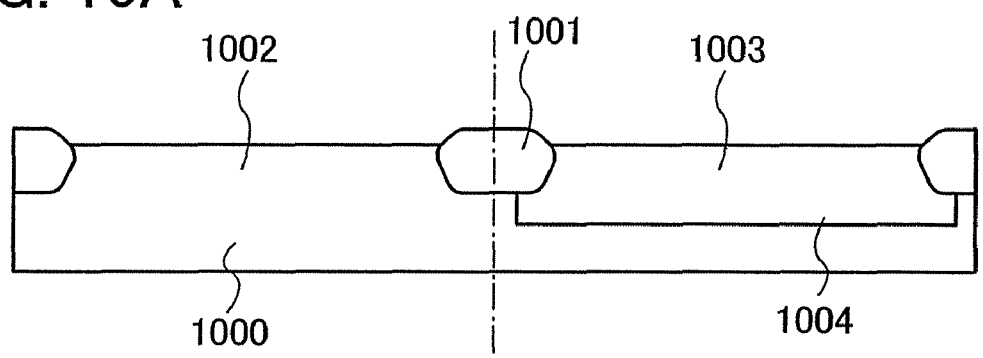
FIGS. 10A to 10C are partial cross-sectional views of a transistor included in a semiconductor device of the present invention.

First, separated regions 1002 and 1003 (hereinafter simply referred to as regions 1002 and 1003) are formed in a semiconductor substrate 1000 (see FIG. 10A). The regions 1002 and 1003 provided in the semiconductor substrate 1000 are separated from each other by an insulating film (also referred to as a field oxide film) 1001. The example shown here is the case where a single crystal Si substrate having n-type conductivity is used as the semiconductor substrate 1000, and a p-well 1004 is formed in the region 1003 of the semiconductor substrate 1000.

Any substrate can be used as the substrate 1000 as long as it is a semiconductor substrate. For example, a single crystal Si substrate having n-type or p-type conductivity, a compound semiconductor substrate (for example, a GaAs substrate, an InP substrate, a GaN substrate, a SiC substrate, a sapphire substrate, or a ZnSe substrate), a silicon on insulator (SOI) substrate formed by a bonding method or a separation by implanted oxygen (SIMOX) method, or the like can be used.

The regions 1002 and 1003 can be formed by a local oxidation of silicon (LOCOS) method, a trench isolation method, or the like.

In addition, the p-well formed in the region 1003 of the semiconductor substrate 1000 can be formed by selective introduction of the semiconductor substrate 1000 with an impurity element imparting p-type conductivity. As an impurity element imparting p-type conductivity, boron (B), aluminum (Al), gallium (Ga), or the like can be used.

In this embodiment mode, although an impurity element is not introduced into the region 1002 because a semiconductor substrate having n-type conductivity is used as the semiconductor substrate 1000, an n-well may be formed in the region 1002 by introduction of an impurity element imparting n-type conductivity. As an impurity element imparting n-type conductivity, phosphorus (P), arsenic (As), or the like can be used. When a semiconductor substrate having p-type conductivity is used, on the other hand, an impurity element imparting n-type conductivity may be introduced into the region 1002 to form an n-well, without introduction of the impurity element into the region 1003.

Figure 10B:
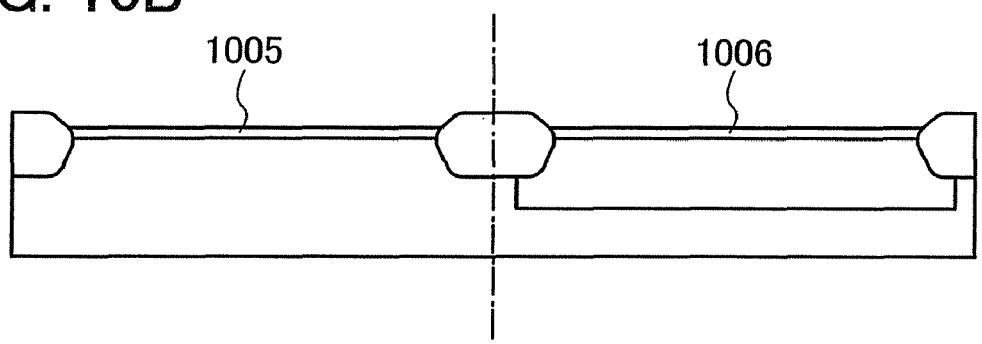

Next, as illustrated in FIG. 10B, insulating films 1005 and 1006 are formed so as to cover the regions 1002 and 1003, respectively.

For example, surfaces of the regions 1002 and 1003 provided in the semiconductor substrate 1000 are oxidized by heat treatment, so that the insulating films 1005 and 1006 can be formed of silicon oxide films. Alternatively, the insulating films 1005 and 1006 may be formed to have a stacked-layer structure of a silicon oxide film and a film containing oxygen and nitrogen (a silicon oxynitride film) by the steps of forming a silicon oxide film by a thermal oxidation method and then nitriding the surface of the silicon oxide film by nitriding treatment.

Alternatively, the insulating films 1005 and 1006 may be formed by plasma treatment as described above. For example, the insulating films 1005 and 1006 can be formed using a silicon oxide ($SiO_x$) film or a silicon nitride ($SiN_x$) film which is obtained by oxidation treatment or nitriding treatment which is performed on the surfaces of the regions 1002 and 1003 provided in the semiconductor substrate 1000 by high-density plasma treatment. Further alternatively, after oxidation treatment is performed on the surfaces of the regions 1002 and 1003 by high-density plasma treatment, nitriding treatment may be performed by performing high-density plasma treatment again. In this case, silicon oxide films are formed on the surfaces of the regions 1002 and 1003, and then silicon oxynitride films are formed on the silicon oxide films. Thus, the insulating films 1005 and 1006 are each formed to have a stacked-layer structure of the silicon oxide film and the silicon oxynitride film. Alternatively, after silicon oxide films are formed on the surfaces of the regions 1002 and 1003 by a thermal oxidation method, oxidation treatment or nitriding treatment may be performed thereon by high-density plasma treatment.

The insulating films 1005 and 1006 function as gate insulating films of transistors which will be completed later.

Figure 10C:
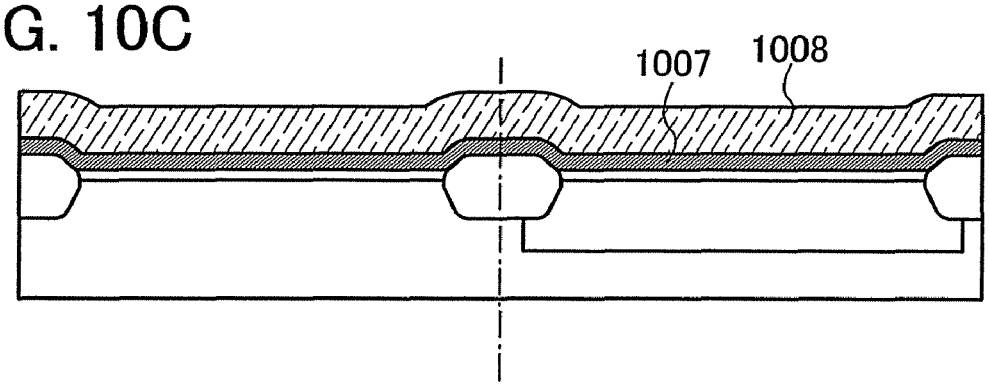

Next, as illustrated in FIG. 10C, a conductive film is formed so as to cover the insulating films 1005 and 1006 which are formed over the regions 1002 and 1003, respectively. Here, an example is shown in which conductive films 1007 and 1008 are sequentially stacked as the conductive film. Needless to say, the conductive film may be formed to have a single-layer structure or a stacked-layer structure of three or more layers.

As each material of the conductive films 1007 and 1008, an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component can be used. Alternatively, a metal nitride film obtained by nitridation of the above element can be used. Besides, a semiconductor material typified by polycrystalline silicon doped with an impurity element such as phosphorus can be used.

In this case, a stacked-layer structure is employed in which the conductive film 1007 is formed using tantalum nitride and the conductive film 1008 is formed thereover using tungsten. Alternatively, it is also possible to form the conductive film 1007 using tungsten nitride, molybdenum nitride, or titanium nitride in a single-layer film or a stacked-layer film and form the conductive film 1008 using tantalum, molybdenum, or titanium in a single-layer film or a stacked-layer film.

Figure 11A:
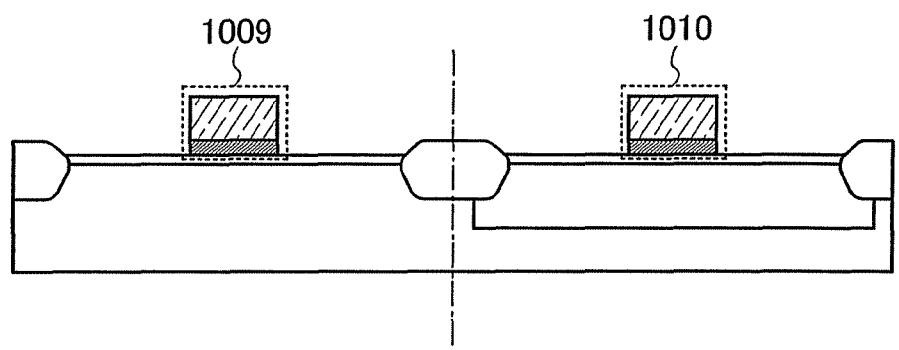
FIGS. 11A to 11C are partial cross-sectional views of a transistor included in a semiconductor device of the present invention.

Next, the stacked conductive films 1007 and 1008 are selectively removed by etching, so that the conductive films 1007 and 1008 remain above part of the regions 1002 and 1003, respectively. Thus, gate electrodes 1009 and 1010 are formed, as illustrated in FIG. 11A.

Figure 11B:
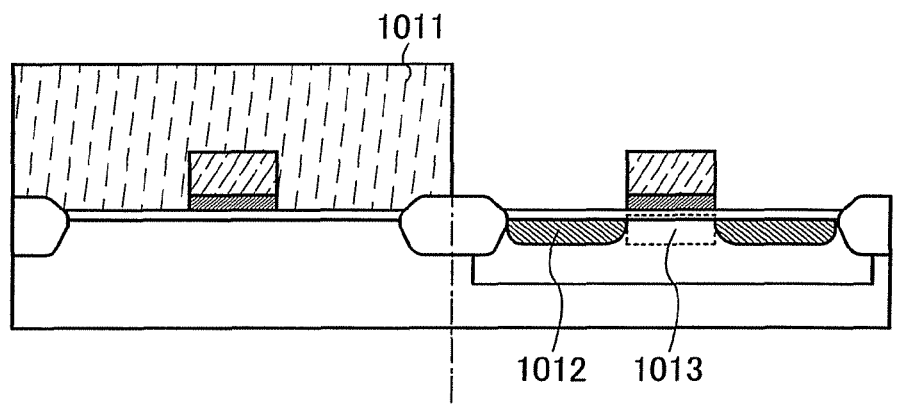

Next, a resist mask 1011 is selectively formed so as to cover the region 1002, and an impurity element is introduced into the region 1003, using the resist mask 1011 and the gate electrode 1010 as masks, so that impurity regions are formed (see FIG. 11B). As the impurity element, an impurity element imparting n-type conductivity or an impurity element imparting p-type conductivity is used. As an impurity element imparting n-type conductivity, phosphorus (P), arsenic (As), or the like can be used. As an impurity element imparting p-type conductivity, boron (B), aluminum (Al), gallium (Ga), or the like can be used. Here, phosphorus (P) is used as the impurity element.

By introduction of an impurity element, impurity regions 1012 which form source and drain regions and a channel formation region 1013 are formed in the region 1003, as illustrated in FIG. 11B.

Figure 11C:
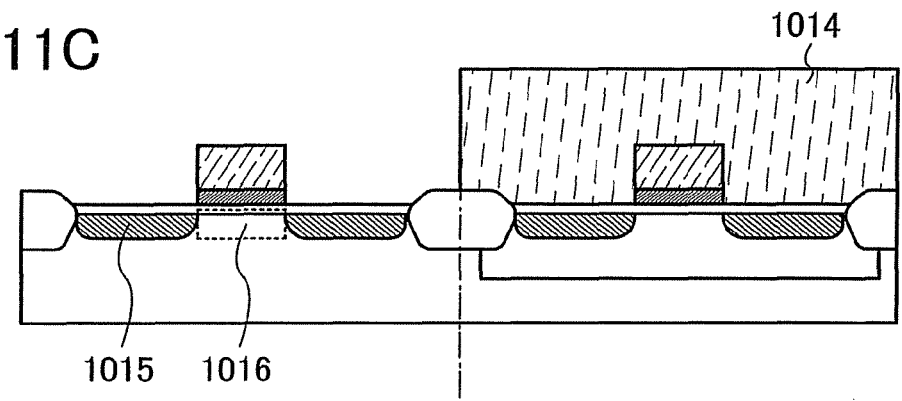

Next, as illustrated in FIG. 11C, a resist mask 1014 is selectively formed so as to cover the region 1003, and an impurity element is introduced into the region 1002, using the resist mask 1014 and the gate electrode 1009 as masks, so that impurity regions are formed. As the impurity element, an impurity element imparting n-type conductivity or an impurity element imparting p-type conductivity is used. As an impurity element imparting n-type conductivity, phosphorus (P), arsenic (As), or the like can be used. As an impurity element imparting p-type conductivity, boron (B), aluminum (Al), gallium (Ga), or the like can be used. At this time, an impurity element (for example, boron (B)) of a conductivity type different from that of the impurity element introduced into the region 1003 in FIG. 11B is used. As a result, impurity regions 1015 which form source and drain regions and a channel formation region 1016 are formed in the region 1002.

Figure 12:
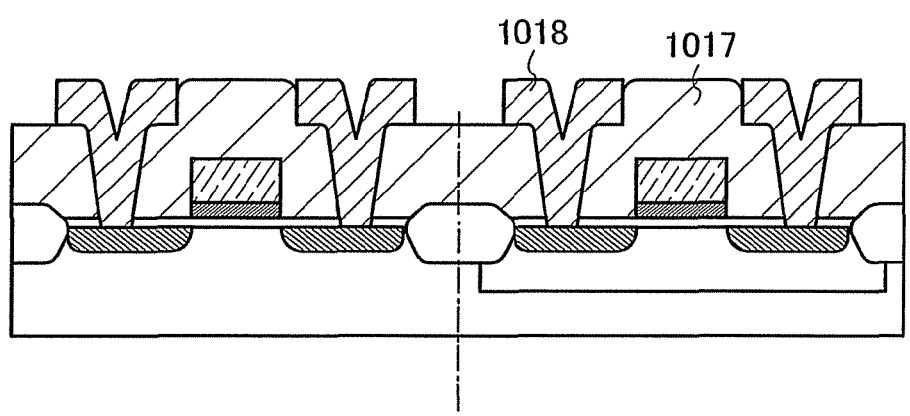
FIG. 12 is a partial cross-sectional view of a transistor included in a semiconductor device of the present invention.

Next, as illustrated in FIG. 12, a second insulating film 1017 is formed so as to cover the insulating films 1005 and 1006 and the gate electrodes 1009 and 1010. Then, wirings 1018, which are electrically connected to the impurity regions 1012 and 1015 formed in the regions 1002 and 1003 respectively, are formed over the second insulating film 1017.

The second insulating film 1017 can be formed of an insulating film containing oxygen and/or nitrogen such as silicon oxide ($SiO_x$), silicon nitride ($SiN_x$), silicon oxynitride ($SiO_xN_y$, where x>y), or silicon nitride oxide ($SiN_xO_y$, where x>y); a film containing carbon such as diamond-like carbon (DLC); an organic material such as epoxy, polyimide, polyamide, polyvinyl phenol, benzocyclobutene, or acrylic; or a siloxane material such as a siloxane resin in a single-layer structure or a stacked-layer structure by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (for example, an alkyl group or an aryl group) is used. Alternatively, a fluoro group may be used as the substituent, or both a fluoro group and an organic group containing at least hydrogen may be used.

The wirings 1018 are formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component in a single-layer structure or a stacked-layer structure by a CVD method, a sputtering method or the like. An alloy material containing aluminum as its main component corresponds to, for example, a material which contains aluminum as its main component and also contains nickel, or a material which contains aluminum as its main component, and also contains nickel and one of or both carbon and silicon. The wirings 1018 may be formed to have a stacked-layer structure of a barrier film, an aluminum-silicon (Al—Si) film, and a barrier film or a stacked-layer structure of a barrier film, an aluminum silicon (Al—Si) film, a titanium nitride film, and a barrier film. Note that the "barrier film" corresponds to a thin film formed of titanium, a nitride of titanium, molybdenum, or a nitride of molybdenum. Aluminum and aluminum silicon are suitable materials for forming the wirings 1018 because they have low resistance and are inexpensive. When barrier layers are provided as the top layer and the bottom layer, generation of hillocks of aluminum or aluminum silicon can be prevented. In addition, when a barrier film formed of titanium which is an element having a high reducing property is formed, even when there is a thin natural oxide film formed on a semiconductor film, the natural oxide film can be chemically reduced, and a favorable contact between the wiring 1018 and the semiconductor film can be obtained.

In a foregoing manner, a MOS transistor can be manufactured using a single-crystal substrate. Note that a structure of the transistor is not limited to the above, and for example, the structure may be an inversely staggered structure, a finFET structure, or the like. Note that with a finFET structure, a short-channel effect in accordance with miniaturization of a size of a transistor can be suppressed.

Note that this embodiment mode can be combined with any of the description of other embodiment modes and embodiments as appropriate.

Embodiment Mode 7

In this embodiment mode, a method for manufacturing a transistor included in a semiconductor device or a nonvolatile memory of the present invention, which is different from the above embodiment modes, will be described with reference to partial cross-sectional views illustrated in FIGS. 13A to 13C, 14A to 14C, 15A to 15C, 16A, and 16B. The transistor included in the semiconductor device or the nonvolatile memory of the present invention may be a MOS transistor provided by a different manufacturing method from that of the MOS transistor over a single-crystal substrate described in the above embodiment mode.

Figure 13A:
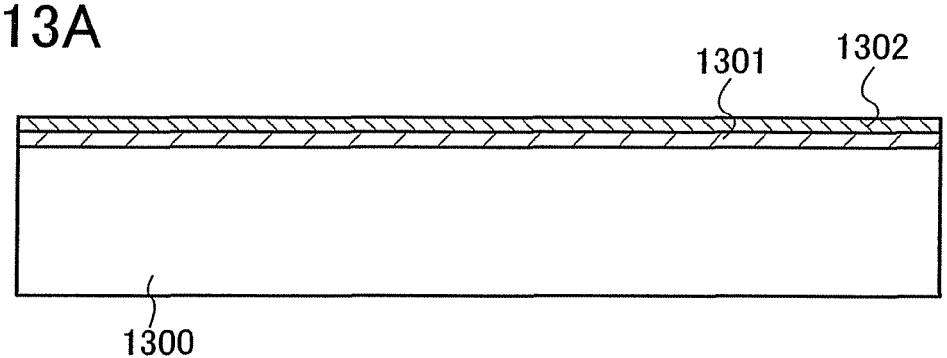
FIGS. 13A to 13C are partial cross-sectional views of a transistor included in a semiconductor device of the present invention.

First, as illustrated in FIG. 13A, an insulating film is formed over a substrate 1300. Here, a single-crystal Si having n-type conductivity is used as the substrate 1300, and an insulating film 1301 and an insulating film 1302 are formed over the substrate 1300. For example, the substrate 1300 is subjected to heat treatment to form silicon oxide ($SiO_x$) as the insulating film 1301, and then silicon nitride ($SiN_x$) is formed over the insulating film 1301 by a CVD method.

Any substrate can be used as the substrate 1300 as long as it is a semiconductor substrate. For example, a single crystal Si substrate having n-type or p-type conductivity, a compound semiconductor substrate (for example, a GaAs substrate, an InP substrate, a GaN substrate, a SiC substrate, a sapphire substrate, or a ZnSe substrate), a silicon on insulator (SOI) substrate formed by a bonding method or a separation by implanted oxygen (SIMOX) method, or the like can be used.

Alternatively, the insulating film 1302 may be provided by forming the insulating film 1301 and then nitriding the insulating film 1301 by high-density plasma treatment. Note that the insulating film provided over the substrate 1300 may be provided in a single-layer structure or a stacked-layer structure of three or more layers.

Figure 13B:
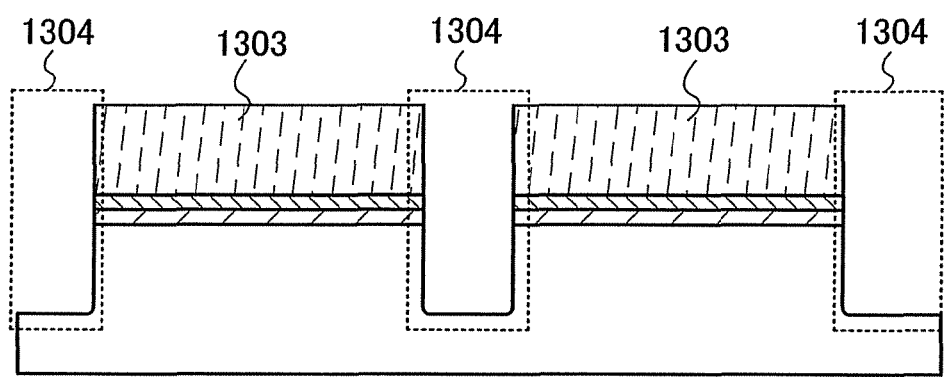

Next, as illustrated in FIG. 13B, a pattern of a resist mask 1303 is selectively formed over the insulating film 1302 and etching is selectively performed with the use of the resist mask 1303 as a mask; accordingly, depressed portions 1304 are selectively formed in the substrate 1300. Etching of the substrate 1300, the insulating films 1301 and 1302 can be performed by dry etching using plasma.

Figure 13C:
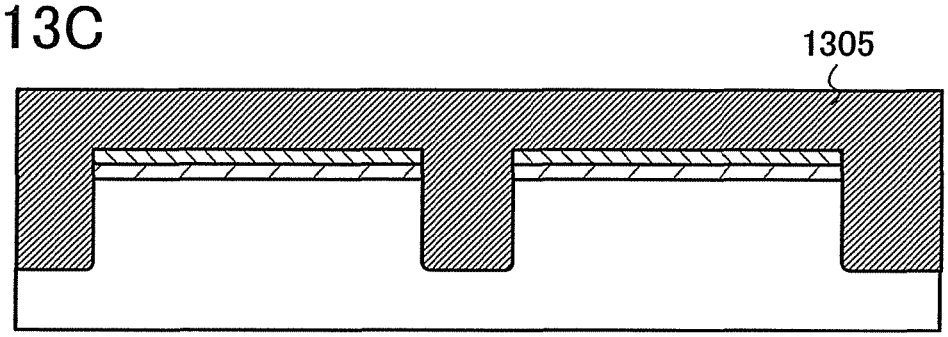

Next, as illustrated in FIG. 13C, after the pattern of the resist mask 1303 is removed, an insulating film 1305 is formed to fill the depressed portions 1304 formed in the substrate 1300.

The insulating film 1305 is formed by a CVD method, a sputtering method, or the like, using an insulating material such as silicon oxide, silicon nitride, silicon oxynitride ($SiO_xN_y$, where x>y>0), or silicon nitride oxide ($SiN_xO_y$, where x>y>0). Here, as the insulating film 1305, a silicon oxide film is formed using a tetraethyl orthosilicate (TEOS) gas by a normal pressure CVD method or a low pressure CVD method.

Figure 14A:
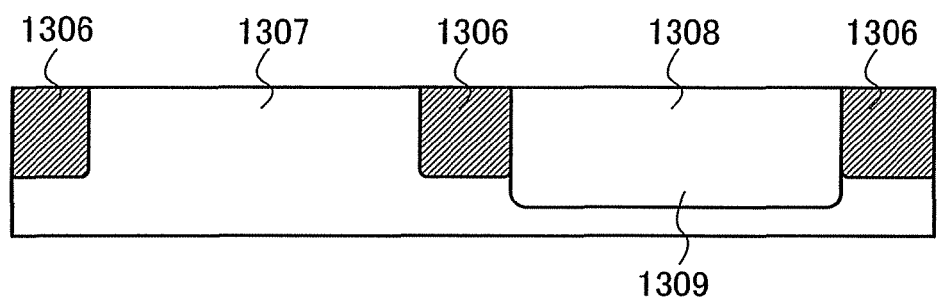
FIGS. 14A to 14C are partial cross-sectional views of a transistor included in a semiconductor device of the present invention.

Next, as illustrated in FIG. 14A, a surface of the substrate 1300 is exposed by performing grinding treatment, polishing treatment, or chemical mechanical polishing (CMP) treatment. Here, by exposure of the surface of the substrate 1300, regions 1307 and 1308 are provided between insulating films 1306 formed in the depressed portions 1304 of the substrate 1300. Note that the insulating films 1306 are obtained by removal of the insulating film 1305 formed over the surface of the substrate 1300 by grinding treatment, polishing treatment, or CMP treatment. Subsequently, by selectively introduction of an impurity element imparting p-type conductivity, a p-well 1309 is formed in the region 1308.

As an impurity element imparting p-type conductivity, boron (B), aluminum (Al), gallium (Ga), or the like can be used. Here, boron (B) is introduced into the region 1308 as the impurity element.

In this embodiment mode, although an impurity element is not introduced into the region 1307 because a semiconductor substrate having n-type conductivity is used as the semiconductor substrate 1300, an n-well may be formed in the region 1307 by introduction of an impurity element imparting n-type conductivity. As an impurity element imparting n-type conductivity, phosphorus (P), arsenic (As), or the like can be used.

When a semiconductor substrate having p-type conductivity is used, on the other hand, an impurity element imparting n-type conductivity may be introduced into the region 1307 to form an n-well, without introduction of the impurity element into the region 1308.

Figure 14B:
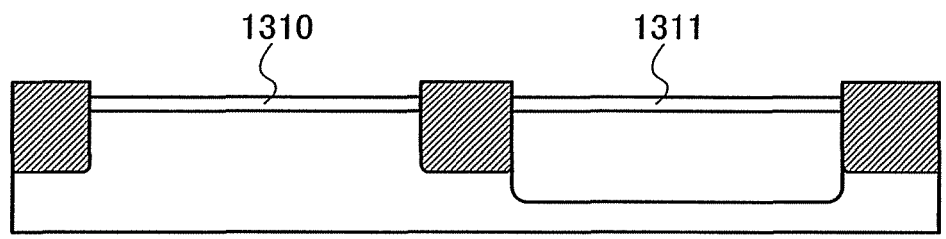

Next, as illustrated in FIG. 14B, insulating films 1310 and 1311 are formed over surfaces of the regions 1307 and 1308 of the substrate 1300, respectively.

For example, surfaces of the regions 1307 and 1308 provided in the substrate 1300 are oxidized by, for example, heat treatment, so that the insulating films 1310 and 1311 can be formed of silicon oxide films. Alternatively, the insulating films 1310 and 1311 may be formed to have a stacked-layer structure of a silicon oxide film and a film containing oxygen and nitrogen (a silicon oxynitride film) by the steps of forming a silicon oxide film by a thermal oxidation method and then nitriding the surface of the silicon oxide film by nitriding treatment.

Alternatively, the insulating films 1310 and 1311 may be formed by plasma treatment as described above. For example, the insulating films 1310 and 1311 can be formed using a silicon oxide ($SiO_x$) film or a silicon nitride ($SiN_x$) film which is obtained by oxidation treatment or nitriding treatment which is performed on the surfaces of the regions 1307 and 1308 provided in the substrate 1300 by high-density plasma treatment. Further alternatively, after oxidation treatment is performed on the surfaces of the regions 1307 and 1308 by high-density plasma treatment, nitriding treatment may be performed by performing high-density plasma treatment again. In this case, silicon oxide films are formed on the surfaces of the regions 1307 and 1308, and then silicon oxynitride films are formed on the silicon oxide films. Thus, the insulating films 1310 and 1311 are each formed to have a stacked-layer structure of the silicon oxide film and the silicon oxynitride film. Alternatively, after silicon oxide films are formed on the surfaces of the regions 1307 and 1308 by a thermal oxidation method, oxidation treatment or nitriding treatment may be performed by high-density plasma treatment.

The insulating films 1310 and 1311 formed in the regions 1307 and 1308 of the substrate 1300, respectively, function as gate insulating films of transistors which will bee completed later.

Figure 14C:
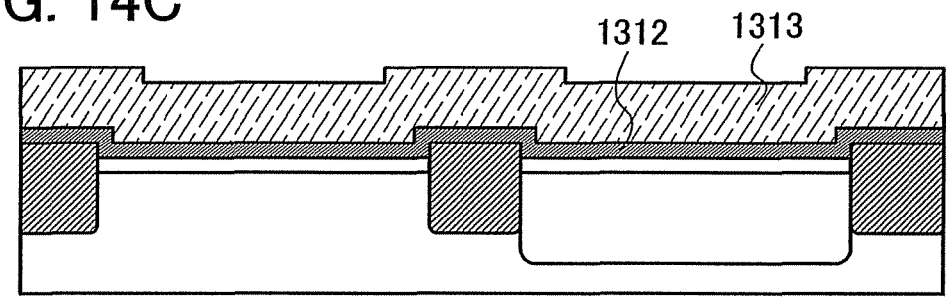

Next, as illustrated in FIG. 14C, a conductive film is formed so as to cover the insulating films 1310 and 1311 which are formed over the regions 1307 and 1308 provided in the substrate 1300, respectively. Here, an example is shown in which conductive films 1312 and 1313 are sequentially stacked as the conductive film. Needless to say, the conductive film may be formed to have a single-layer structure or a stacked-layer structure of three or more layers.

As each material of the conductive films 1312 and 1313, an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component can be used. Alternatively, a metal nitride film obtained by nitridation of the above element can be used. Besides, a semiconductor material typified by polycrystalline silicon doped with an impurity element such as phosphorus can be used.

In this case, a stacked-layer structure is employed in which the conductive film 1312 is formed using tantalum nitride and the conductive film 1313 is formed thereover using tungsten. Alternatively, it is also possible to form the conductive film 1312 using tantalum nitride, tungsten nitride, molybdenum nitride, or titanium nitride in a single-layer film or a stacked-layer film and form the conductive film 1313 using tungsten, tantalum, molybdenum, or titanium in a single-layer film or a stacked-layer film.

Figure 15A:
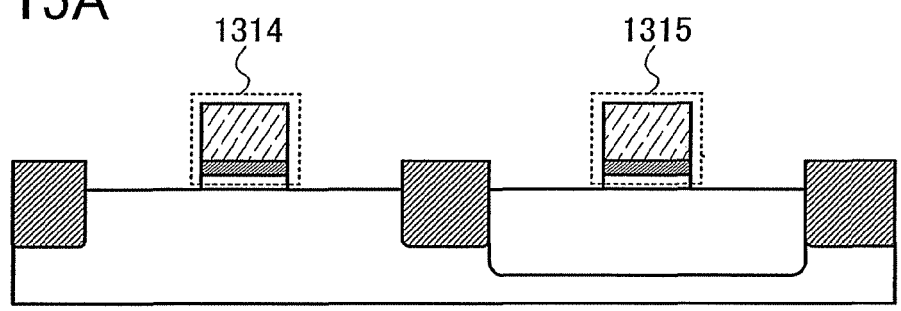
FIGS. 15A to 15C are partial cross-sectional views of a transistor included in a semiconductor device of the present invention.

Next, as illustrated in FIG. 15A, the stacked conductive films 1312 and 1313 are selectively removed by etching, so that the conductive films 1312 and 1313 remain above part of the regions 1307 and 1308 of the substrate 1300, respectively. Thus, conductive films 1314 and 1315, which each function as a gate electrode, are formed. In addition, here, surfaces of the regions 1307 and 1308 of the substrate 1300 that do not overlap with the conductive films 1314 and 1315 are exposed.

Specifically, in the region 1307 of the substrate 1300, a portion of the insulating film 1310 formed under the conductive film 1314 that does not overlap with the conductive film 1314 is selectively removed, and an end portion of the conductive film 1314 and an end portion of the insulating film 1310 are made to roughly match. In addition, in the region 1308, part of the insulating film 1311 formed under the conductive film 1315 that does not overlap with the conductive film 1315 is selectively removed and an end portion of the conductive film 1315 and an end portion of the insulating film 1311 are made to roughly match.

In this case, insulating films and the like of the portions that do not overlap may be removed at the same time as formation of the conductive films 1314 and 1315. Alternatively, the insulating films and the like of the portions that do not overlap may be removed using the resist mask, which is left after the conductive films 1314 and 1315 are formed, or the conductive films 1314 and 1315 as a mask.

Figure 15B:
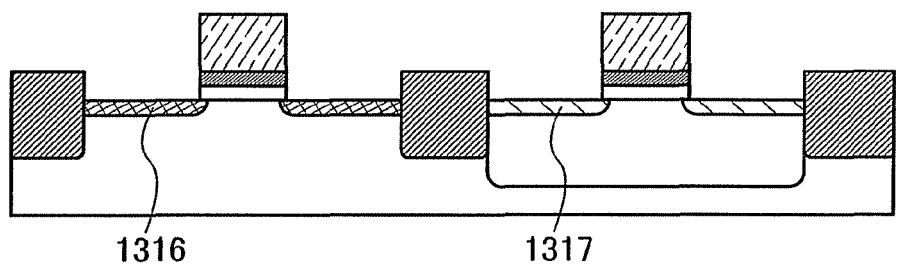

Next, as illustrated in FIG. 15B, an impurity element is selectively introduced into the regions 1307 and 1308 of the substrate 1300. Here, a low-concentration impurity element imparting n-type conductivity is selectively introduced into the region 1308, using the conductive film 1315 as a mask, to form an impurity region 1317. On the other hand, a low-concentration impurity element imparting p-type conductivity is selectively introduced into the region 1307, using the conductive film 1314 as a mask, to form an impurity region 1316. As an impurity element imparting n-type conductivity, phosphorus (P), arsenic (As), or the like can be used. As an impurity element imparting p-type conductivity, boron (B), aluminum (Al), gallium (Ga), or the like can be used.

Next, sidewalls 1318 that are in contact with side surfaces of the conductive films 1314 and 1315 are formed. Specifically, a film containing an inorganic material such as silicon, an oxide of silicon, or a nitride or silicon, or a film containing an organic material such as an organic resin is formed in a single-layer structure or a stacked-layer structure by a plasma CVD method, a sputtering method, or the like. Then, the insulating films are selectively etched by anisotropic etching mainly in a perpendicular direction, so as to be formed in contact with the side surfaces of the conductive films 1314 and 1315. Note that the sidewalls 1318 are used as masks for doping in forming lightly doped drain (LDD) regions. In addition, here, the sidewalls 1318 are formed to be also in contact with side surfaces of the insulating films 1310 and 1311 which are formed under the conductive films 1314 and 1315, respectively.

Figure 15C:
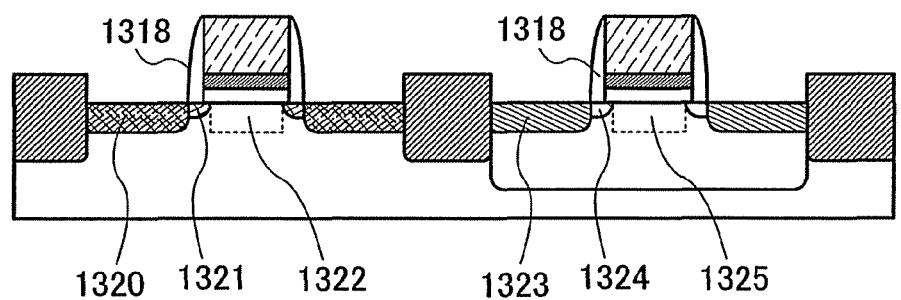

Subsequently, by introducing an impurity element into each of the regions 1307 and 1308 of the substrate 1300, using the sidewalls 1318 and the conductive films 1314 and 1315 as masks, impurity regions, which each function as a source or drain region, are formed (see FIG. 15C). Here, a high-concentration impurity element imparting n-type conductivity is introduced into the region 1308 of the substrate 1300, using the sidewalls 1318 and the conductive film 1315 as masks, and a high-concentration impurity element imparting p-type conductivity is introduced into the region 1307, using the sidewalls 1318 and the conductive film 1314 as masks.

As a result, in the region 1307 of the substrate 1300, an impurity region 1320 which forms a source or drain region, a low-concentration impurity region 1321 which forms an LDD region, and a channel formation region 1322 are formed. In addition, in the region 1308 of the substrate 1300, an impurity region 1323 which forms a source or drain region, a low-concentration impurity region 1324 which forms an LDD region, and a channel formation region 1325 are formed.

Note that in this embodiment mode, introduction of impurity elements is performed in a state where the regions 1307 and 1308 of the substrate 1300, which do not overlap with the conductive films 1314 and 1315, are exposed. Accordingly, the channel formation regions 1322 and 1325 formed in the regions 1307 and 1308 of the substrate 1300, respectively, can be formed in a self-aligned manner with the conductive films 1314 and 1315, respectively.

Figure 16A:
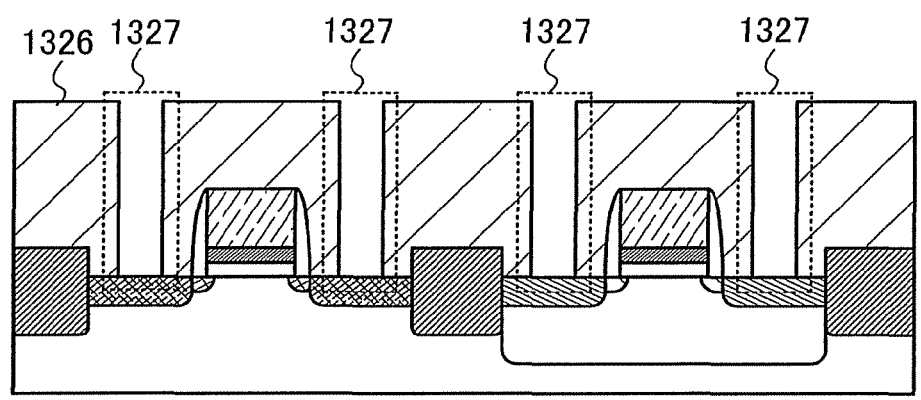
FIGS. 16A and 16B are partial cross-sectional views of a transistor included in a semiconductor device of the present invention.

Next, as illustrated in FIG. 16A, a second insulating film 1326 is formed so as to cover the insulating films, conductive films, and the like provided over the regions 1307 and 1308 of the substrate 1300, and openings 1327 are formed in the insulating film 1326.

The second insulating film 1326 can be formed of an insulating film containing oxygen and/or nitrogen such as silicon oxide ($SiO_x$), silicon nitride ($SiN_x$), silicon oxynitride ($SiO_xN_y$, where x>y), or silicon nitride oxide ($SiN_xO_y$, where x>y); a film containing carbon such as diamond-like carbon (DLC); an organic material such as epoxy, polyimide, polyamide, polyvinyl phenol, benzocyclobutene, or acrylic; or a siloxane material such as a siloxane resin in a single-layer structure or a stacked-layer structure by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (for example, an alkyl group or an aryl group) is used. Alternatively, a fluoro group may be used as the substituent, or both a fluoro group and an organic group containing at least hydrogen may be used.

Figure 16B:
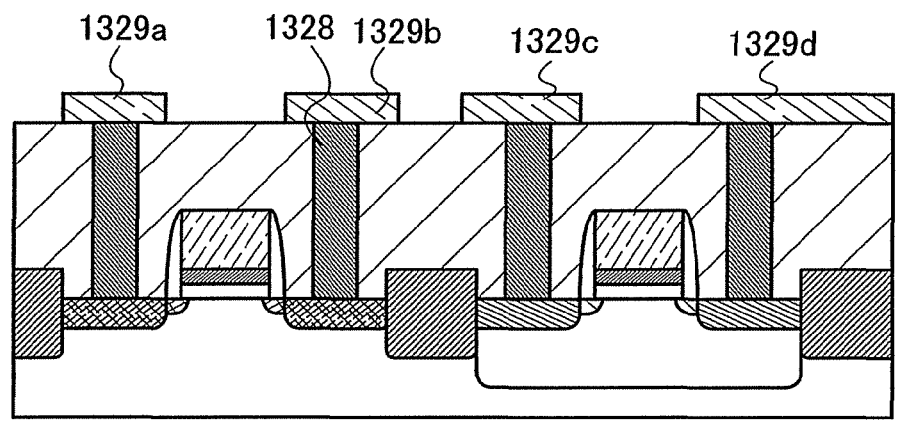

Next, as illustrated in FIG. 16B, a conductive film 1328 is formed in each of the openings 1327 by a CVD method, and conductive films 1329a to 1329d are selectively formed over the insulating film 1326 so as to be electrically connected to the conductive films 1328.

The conductive films 1328 and 1329a to 1329d are formed of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as its main component in a single-layer structure or a stacked-layer structure by a CVD method, a sputtering method or the like. An alloy material containing aluminum as its main component corresponds to, for example, a material which contains aluminum as its main component and also contains nickel, or a material which contains aluminum as its main component and also contains nickel and one of or both carbon and silicon. The conductive films 1328 and 1329a to 1329d may be formed to have a stacked-layer structure of a barrier film, an aluminum-silicon (Al—Si) film, and a barrier film or a stacked-layer structure of a barrier film, an aluminum silicon (Al—Si) film, a titanium nitride film, and a barrier film. Note that the "barrier film" corresponds to a thin film formed of titanium, a nitride of titanium, molybdenum, or a nitride of molybdenum. Aluminum and aluminum silicon are suitable materials for forming the conductive films 1328 because they have high resistance and are inexpensive. When barrier layers are provided as the top layer and the bottom layer, generation of hillocks of aluminum or aluminum silicon can be prevented. When a barrier film formed of titanium which is an element having a high reducing property is formed, even when there is a thin natural oxide film formed on the crystalline semiconductor film, the natural oxide film can be chemically reduced, and a favorable contact between the conductive films 1328 and the crystalline semiconductor film can be obtained. Here, the conductive films 1328 can be formed by selective growth of tungsten (W) by a CVD method.

By the foregoing steps, a p-type transistor formed in the region 1307 and an n-type transistor formed in the region 1308 of the substrate 1300 can be manufactured.

Note that a structure of the transistor is not limited to the above, and for example, the structure may be an inversely staggered structure, a finFET structure, or the like. Note that with a finFET structure, a short-channel effect in accordance with miniaturization of a size of a transistor can be suppressed.

Further, the transistor included in the nonvolatile memory or the semiconductor device is not limited to the above, and an organic transistor in which a channel formation region is formed from an organic substance may be employed.

Note that this embodiment mode can be combined with any of the description of other embodiment modes and embodiments as appropriate.

Embodiment 1

In this embodiment, resistivity of a wiring formed according to the present invention will be described.

First, a composition in which silver nanoparticles are dispersed was discharged onto a glass substrate by a droplet discharge method. For the discharged composition, that is, a discharge material, a solution in which silver nanoparticles are dispersed in water and a water-soluble organic solvent, with the nanoparticles coated with an organic substance, was used. Note that a concentration of silver in the solution is approximately 22.5 wt % (±2.5 wt %), and a grain size of the nanoparticle which was used is greater than or equal to 20 nm and less than or equal to 30 nm. In addition, a discharge material, viscosity of which is approximately 15 Pa·s at 25° C. and surface tension of which is approximately 35 mN/m, was used.

Next, the substrate was heated with a hot plate at 80° C. for 15 minutes, and the solvent was vaporized. Therefore, silver nanoparticles and an organic substance which coats the silver nanoparticles were left over the substrate.

After that, the substances left over the substrate, that is, a discharge substance was subjected to pretreatment by active oxygen with the use of a low-pressure mercury lamp in the air. When a measured wavelength is set at 254 nm, a lamp having 7 mW/cm$^2$ illuminance is used as the low-pressure mercury lamp. As shown in Embodiment Mode 1, light emission of a low-pressure mercury lamp is not limited to 254 nm, and the low-pressure mercury lamp also has light emission of 185 nm. Thus, ozone is obtained by light emission of 185 nm from the low-pressure mercury lamp, and it can be said that pretreatment is performed by ultraviolet irradiation in the presence of ozone. Note that the pretreatment time was set at 10 or 20 minutes.

Next, the substrate was heated with a hot plate at 100° C. for 60 minutes, whereby baking was performed on the discharge substances which have been subjected to pretreatment.

Resistivity of the wirings which were formed in a foregoing manner was examined by a two-probe method. Note that resistivity of a wiring which was formed without pretreatment was also examined for comparison. Results thereof are shown in Table 1. Note that a line width and a thickness of each wiring were approximately 134 μm and approximately 316 nm, respectively. A thickness of each wiring described here means to an average thickness which is obtained by division of cross-sectional areas of the wirings in width direction by line widths, and hereinafter referred to as an average thickness.

TABLE 1

Wiring resistivity with respect to pretreatment time

| | Pretreatment time [min] | | |
|---|---|---|---|
| | 0 | 10 | 20 |
| Resistivity [Ωcm] | 6.52 × 10$^4$ | 8.66 × 10$^{-2}$ | 5.93 × 10$^{-4}$ |

According to Table 1, wiring resistivity is reduced as pretreatment time increases, and it is found that pretreatment by active oxygen at the time of forming a wiring can reduce wiring resistivity. In addition, despite a low baking temperature, a wiring having low resistivity was obtained. Thus, it is found that pretreatment facilitates sintering due to baking. As described above, it can be said that pretreatment can reduce a baking temperature.

In addition, wirings, an average thickness of which is different from that of the above wirings, were also formed, and resistivity thereof was examined. Wiring resistivity of an average thickness, which is approximately 580 nm, with respect to pretreatment time is shown in Table 2. Note that a line width of each wiring was approximately 136 μm.

TABLE 2

Wiring resistivity with respect to pretreatment time

| | Pretreatment time [min] | | |
|---|---|---|---|
| | 0 | 10 | 20 |
| resistivity [Ωcm] | 6.05 × 10$^4$ | 1.98 × 10$^1$ | 3.23 × 10$^{-3}$ |

According to Table 2, it was found that pretreatment by active oxygen at the time of forming a wiring can reduce wiring resistivity even when the wiring has a large thickness. In addition, despite a low baking temperature, a wiring having low resistivity was obtained.

In the above, baking was performed on the discharge substances which have been subjected to pretreatment by heating with a hot plate at 100° C. for 60 minutes; however, a similar experiment was conducted in a case of 30 minutes. Wiring resistivity which was obtained is shown in Table 3. Note that two kinds of wirings having different average thicknesses were formed. Note that a wiring, an average thickness of which is approximately 312 nm, had a line width of approximately 137 μm, and a wiring, an average thickness of which is approximately 576 nm, had a line width of approximately 142 μm.

TABLE 3

Wiring resistivity with respect to pretreatment time

| | Pretreatment time [min] | | | Average thickness [nm] |
|---|---|---|---|---|
| | 0 | 10 | 20 | |
| resistivity [Ωcm] | 9.66 × 10$^4$ | 1.44 × 10$^2$ | 1.64 × 10$^{-3}$ | 312 |
| resistivity [Ωcm] | 1.01 × 10$^5$ | 1.52 × 10$^3$ | 4.28 × 10$^{-1}$ | 576 |

According to Table 3, it was found that pretreatment by active oxygen at the time of forming a wiring can reduce wiring resistivity even when baking was performed for 30 minutes.

As set forth above, pretreatment by active oxygen can reduce a baking temperature at the time of forming a wiring. Alternatively, the baking time can also be shortened.

Embodiment 2

In this embodiment, resistivity of a wiring formed according to the present invention will be described. Note that a wiring formed according to this embodiment was formed using a similar substance and method to Embodiment 1, with the exception that baking was performed by heating a discharge substance, which has been subjected to pretreatment, with a hot plate at 150° C.

First, a composition in which silver nanoparticles are dispersed was discharged onto a glass substrate by a droplet discharge method. For the discharged composition, that is, a discharge material, a material similar to Embodiment 1 was used.

Next, the substrate was heated with a hot plate at 80° C. for 15 minutes, and the solvent was vaporized. Therefore, silver nanoparticles and an organic substance which coats the silver nanoparticles were left over the substrate.

After that, the substances left over the substrate, that is, a discharge substance was subjected to pretreatment by active oxygen with the use of a low-pressure mercury lamp in the air.

When a measured wavelength is set at 254 nm, a lamp, illuminance of which is 7 mW/cm², was used as the low-pressure mercury lamp. As shown in Embodiment Mode 1, light emission of a low-pressure mercury lamp is not limited to 254 nm, and the low-pressure mercury lamp also has light emission of 185 nm. Thus, ozone is obtained by light emission of 185 nm from the low-pressure mercury lamp, and it can be said that pretreatment is performed by ultraviolet irradiation in the presence of ozone. Note that the pretreatment time was set at 10 or 20 minutes, and a wiring without pretreatment was also formed for comparison.

Next, the substrate was heated with a hot plate at 150° C. for 60 minutes, whereby baking was performed on the discharge substances which have been subjected to pretreatment.

Resistivity of two kinds of wirings having different average thicknesses, which were formed in a foregoing manner, was examined by a two-probe method. Results thereof are shown in Table 4. The wirings which are formed have average thicknesses, which were approximately 258 nm and 463 nm, and each wiring width thereof was approximately 136 μm.

TABLE 4

Wiring resistivity with respect to pretreatment time

|  | Pretreatment time [min] | | | Average thickness [nm] |
| --- | --- | --- | --- | --- |
|  | 0 | 10 | 20 |  |
| resistivity [Ωcm] | $1.03 \times 10^{-4}$ | $6.56 \times 10^{-5}$ | $2.99 \times 10^{-5}$ | 258 |
| resistivity [Ωcm] | $1.19 \times 10^{-4}$ | $7.29 \times 10^{-5}$ | $4.42 \times 10^{-5}$ | 463 |

According to Table 4, wiring resistivity is reduced as pretreatment time increases, and it is found that pretreatment by active oxygen at the time of forming a wiring can reduce wiring resistivity. In addition, despite a low baking temperature, a wiring having low resistivity was obtained. Thus, it is found that pretreatment facilitates sintering due to baking.

As set forth above, it can be said that pretreatment by active oxygen can reduce a baking temperature at the time of forming a wiring.

The present application is based on Japanese Patent Application serial no. 2007-053712 filed with Japan Patent Office on Mar. 5, 2007, the entire contents of which are hereby incorporated by reference.

What is claimed is:

1. A method for manufacturing a wiring comprising the steps of:
   forming a partition wall except a formation region of a wiring;
   discharging a composition, in which nanoparticles of a conductive material are dispersed in a solvent, into the formation region of the wiring;
   drying the composition;
   exposing the composition to an oxygen atmosphere after the drying step;
   generating and exposing the composition to an active oxygen by using an ultraviolet irradiation under the oxygen atmosphere so that the composition is not irradiated by the ultraviolet irradiation; and
   performing baking after the step of generating the active oxygen.

2. The method for manufacturing a wiring according to claim 1, wherein the active oxygen is generated by irradiation of ozone with an ultraviolet ray.

3. The method for manufacturing a wiring according to claim 2, wherein the ultraviolet irradiation is performed using at least one of a low-pressure mercury lamp and an excimer lamp.

4. The method for manufacturing a wiring according to claim 2, wherein the ozone is generated by irradiation of oxygen with an ultraviolet ray having a 240 nm wavelength.

5. The method for manufacturing a wiring according to claim 2, wherein parts of the ozone and the active oxygen are generated by irradiation of oxygen with an ultraviolet ray having a wavelength of less than or equal to 175 nm.

6. The method for manufacturing a wiring according to claim 1, wherein a grain size of the nanoparticles is greater than or equal to 1 nm and less than or equal to 200 nm.

7. A method for manufacturing a wiring comprising the steps of:
   forming a partition wall except a formation region of a wiring;
   discharging a composition in which nanoparticles of a conductive material are dispersed in a solvent, into the formation region of the wiring;
   drying the composition;
   exposing the composition to an ozone atmosphere after the drying step;
   generating and exposing the composition to an active oxygen by using an ultraviolet irradiation under the ozone atmosphere so that the composition is not irradiated by the ultraviolet irradiation; and
   performing baking after the step of generating the active oxygen.

8. The method for manufacturing a wiring according to claim 7, wherein the ultraviolet irradiation is performed using at least one of a low-pressure mercury lamp and an excimer lamp.

9. The method for manufacturing a wiring according to claim 7, wherein a grain size of the nanoparticles is greater than or equal to 1 nm and less than or equal to 200 nm.

10. A method for manufacturing a wiring comprising the steps of:
    forming a partition wall except a formation region of a wiring;
    discharging a composition in which nanoparticles of a conductive material are dispersed in a solvent, into the formation region of the wiring;
    drying the composition;
    exposing the composition to air after the drying step;
    generating and exposing the composition to an active oxygen by using an ultraviolet irradiation with an ultraviolet ray of less than or equal to 240 nm in air so that the composition is not irradiated by the ultraviolet irradiation; and
    performing baking after the step of generating the active oxygen.

11. The method for manufacturing a wiring according to claim 10, wherein the ultraviolet irradiation is performed using at least one of a low-pressure mercury lamp and an excimer lamp.

12. The method for manufacturing a wiring according to claim 10, wherein a grain size of the nanoparticles is greater than or equal to 1 nm and less than or equal to 200 nm.

13. A method for manufacturing a wiring comprising the steps of:
- forming a partition wall except a formation region of a wiring;
- discharging a composition in which nanoparticles of a conductive material are dispersed in a solvent, into the formation region of the wiring;
- drying the composition;
- exposing the composition to air after the drying step;
- generating and exposing the composition to an active oxygen by using an ultraviolet irradiation with an ultraviolet ray of less than or equal to 175 nm in air so that the composition is not irradiated by the ultraviolet irradiation; and
- performing baking after the step of generating the active oxygen.

14. The method for manufacturing a wiring according to claim 13, wherein the ultraviolet irradiation is performed using an excimer lamp.

15. The method for manufacturing a wiring according to claim 13, wherein a grain size of the nanoparticles is greater than or equal to 1 nm and less than or equal to 200 nm.

16. A method for manufacturing a storage element comprising the steps of:
- forming a first conductive layer;
- forming a memory layer over the first conductive layer;
- forming a partition wall except a formation region of a second conductive layer over the memory layer;
- discharging a composition, in which nanoparticles of a conductive material are dispersed in a solvent, into the formation region of the second conductive layer;
- drying the composition;
- exposing the composition to an oxygen atmosphere after the step of drying step;
- generating and exposing the composition to an active oxygen by using an ultraviolet irradiation under the oxygen atmosphere so that the composition is not irradiated by the ultraviolet irradiation; and
- performing baking after the step of generating the active oxygen to form the second conductive layer.

17. The method for manufacturing a storage element according to claim 16, wherein the memory layer is an organic compound layer.

18. A method for manufacturing a storage element comprising the steps of:
- forming a first conductive layer;
- forming a memory layer over the first conductive layer;
- forming a partition wall except a formation region of a second conductive layer over the memory layer;
- discharging a composition, in which nanoparticles of a conductive material are dispersed in a solvent, into the formation region of the second conductive layer;
- drying the composition;
- exposing the composition to an ozone atmosphere after the drying step;
- generating and exposing the composition to an active oxygen by using an ultraviolet irradiation under the ozone atmosphere so that the composition is not irradiated by the ultraviolet irradiation; and
- performing baking after the step of generating the active oxygen to form the second conductive layer.

19. The method for manufacturing a storage element according to claim 18, wherein the memory layer is an organic compound layer.

20. A method for manufacturing a storage element comprising the steps of:
- forming a first conductive layer;
- forming a memory layer over the first conductive layer;
- forming a partition wall except a formation region of a second conductive layer over the memory layer;
- discharging a composition, in which nanoparticles of a conductive material are dispersed in a solvent, into the formation region of the second conductive layer;
- drying the composition;
- exposing the composition to air after the drying step;
- generating and exposing the composition to an active oxygen by using an ultraviolet irradiation with an ultraviolet ray of less than or equal to 240 nm in air so that the composition is not irradiated by the ultraviolet irradiation; and
- performing baking after the step of generating the active oxygen to form the second conductive layer.

21. The method for manufacturing a storage element according to claim 20, wherein the memory layer is an organic compound layer.

22. A method for manufacturing a storage element comprising the steps of:
- forming a first conductive layer;
- forming a memory layer over the first conductive layer;
- forming a partition wall except a formation region of a second conductive layer over the memory layer;
- discharging a composition, in which nanoparticles of a conductive material are dispersed in a solvent, into the formation region of the second conductive layer;
- drying the composition;
- exposing the composition to air after the drying steps;
- generating and exposing the composition to an active oxygen by using an ultraviolet irradiation with an ultraviolet ray of less than or equal to 175 nm in air so that the composition is not irradiated by the ultraviolet irradiation; and then
- performing baking after the step of generating the active oxygen to form the second conductive layer.

23. The method for manufacturing a storage element according to claim 22, wherein the memory layer is an organic compound layer.

* * * * *